(12) United States Patent
Sawashima et al.

(10) Patent No.: US 11,810,795 B2
(45) Date of Patent: Nov. 7, 2023

(54) SUBSTRATE TREATING APPARATUS

(71) Applicant: SCREEN Holdings Co., Ltd., Kyoto (JP)

(72) Inventors: Jun Sawashima, Kyoto (JP); Takahiro Yamaguchi, Kyoto (JP); Kenji Kobayashi, Kyoto (JP)

(73) Assignee: SCREEN Holdings Co., Ltd

( * ) Notice: Subject to any disclaimer, the term of this patent is extended or adjusted under 35 U.S.C. 154(b) by 438 days.

(21) Appl. No.: 17/182,530

(22) Filed: Feb. 23, 2021

(65) Prior Publication Data

US 2021/0265178 A1 Aug. 26, 2021

(30) Foreign Application Priority Data

Feb. 26, 2020 (JP) ................................ 2020-030381

(51) Int. Cl.
*H01L 21/67* (2006.01)
*H01L 21/687* (2006.01)

(52) U.S. Cl.
CPC .. *H01L 21/67023* (2013.01); *H01L 21/67167* (2013.01); *H01L 21/67178* (2013.01); *H01L 21/67184* (2013.01); *H01L 21/68707* (2013.01)

(58) Field of Classification Search
CPC ................................................ H01L 21/67023
See application file for complete search history.

(56) References Cited

U.S. PATENT DOCUMENTS

2011/0308626 A1 12/2011 Ogata et al. ........................ 137/2
2012/0160279 A1 6/2012 Konishi et al. ................. 134/99
2012/0227768 A1 9/2012 Morita et al. ................... 134/18
2014/0026927 A1 1/2014 Ogata et al. ................ 134/104.2
2015/0314338 A1 11/2015 Morioka et al.
2016/0126112 A1 5/2016 Minamida et al.

(Continued)

FOREIGN PATENT DOCUMENTS

| JP | 2013-089689 A | 5/2013 |
| JP | 2014-197592 A | 10/2014 |
| JP | 2019-016818 A | 1/2019 |

(Continued)

OTHER PUBLICATIONS

Office Action dated Mar. 22, 2023 for corresponding Korean Patent Application No. 10-2021-0025557.

(Continued)

*Primary Examiner* — Jason Y Ko
(74) *Attorney, Agent, or Firm* — Ostrolenk Faber LLP

(57) ABSTRACT

Disclosed is a substrate treating apparatus. All treating units are each arranged such that a treatment chamber, a chemical piping space, and an exhaust chamber are located side by side along a transportation space, the chemical piping space is located on a first side of the treatment chamber, and the exhaust chamber faces the chemical piping space across the treatment chamber when seen from the transportation space. The exhaust chamber faces the chemical piping space across the treatment chamber, leading to prevention of obstruction of a passage for passing a pipe, configured to supply a chemical to a substrate held by a holding rotator, by an exhaust pipe. Moreover, a single type of treating units is enough for the substrate treating apparatus instead of two types of treating units currently used. This results in sharing of components by all the treating units.

7 Claims, 16 Drawing Sheets

(56) References Cited

U.S. PATENT DOCUMENTS

2017/0008044 A1 1/2017 Okumura et al.
2018/0240685 A1 8/2018 Okuya

FOREIGN PATENT DOCUMENTS

| KR | 10-2015-0102998 A | 9/2015 |
| KR | 10-2016-0052346 A | 5/2016 |
| KR | 10-2017-0007123 A | 1/2017 |
| KR | 10-2020-0018825 A | 2/2020 |
| TW | 201239974 A | 10/2012 |

OTHER PUBLICATIONS

Office Action dated Sep. 13, 2022 for corresponding Korean Patent Application No. 10-2021-0025557.
Office Action dated Dec. 6, 2021 for corresponding Taiwan Patent Application No. 110106455.

SUBSTRATE TREATING APPARATUS

CROSS-REFERENCE TO RELATED APPLICATIONS

This application claims priority to Japanese Patent Application No. 2020-030381 filed Feb. 26, 2020, the subject matter of which is incorporated herein by reference in entirety.

TECHNICAL FIELD

The present invention relates to a substrate treating apparatus configured to perform treatment to substrates. Examples of substrates include semiconductor substrates, substrates for flat panel displays (FPDs), glass substrates for photomasks, substrates for optical disks, substrates for magnetic disks, ceramic substrates, and substrates for solar cells. Examples of the FPDs include liquid crystal display devices and organic electroluminescence (EL) display devices.

DESCRIPTION OF THE RELATED ART

A currently-used substrate treating apparatus includes an indexer 203 and a treating block 211 as shown in FIG. 1 and Japanese Patent Publication No. 2014-197592A. The indexer 203 includes carrier platforms 204 and an indexer mechanism (robot) 206. The carrier platforms 204 each include a carrier C placed thereon where substrates W are accommodated. The indexer mechanism 206 transports a substrate W between the carrier C placed on the carrier platform 204 and the treating block 211. The treating block 211 includes a substrate transport mechanism (robot) 216 and a plurality of treating units 221. The treating units 221 are formed with a plurality of stages (e.g., two stages) in an up-down direction.

Reference is made to FIG. 2. The treating units 221 formed with the stages (e.g., two stages) in the up-down direction include exhaust ports 252 individually. Moreover, three individual exhaust pipes 281, 282, and 283 through which acid exhaust, alkaline exhaust, and organic exhaust flow respectively are provided above the treating unit 221 in the uppermost stage. Exhaust pipes 241 each have a first end connected to the exhaust port 252 of the treating unit 221, and a second end connected to an exhaust switching device 251. The exhaust switching devices 251 are provided above the treating unit 221 in the uppermost stage, and are configured to distribute exhaust from the exhaust ports 252 of the treating units 221 into the three individual exhaust pipes 281, 282, and 283. See, for example, Japanese Patent Publication No. 2019-016818A.

SUMMARY OF INVENTION

Technical Problem

However, the currently-used substrate treating apparatus possesses the following drawbacks. In FIG. 2, for example, when the treating units 221 in two stages are provided in the up-down direction, two exhaust pipes 241 are located so as to extend in a vertical direction up to the exhaust switching devices 251 provided above the treating unit 221 in the upper stage (uppermost stage). FIG. 3 is a schematic plan view of the treating unit 221 in the upper stage. The treating unit 221 includes a treatment chamber 223 and a piping portion 294. The treatment chamber 223 includes a holding rotator 231 configured to hold a substrate W and to rotate the held substrate. The piping portion 294 includes pipes (not shown) each configured to supply an acid, alkaline, or organic chemical, and two exhaust pipes 241 for the treating units 221 in the upper and lower stages, for example.

Here, the two exhaust pipes 241 are located adjacent to the treatment chamber 223 for exhausting gas from the treatment chamber 223. It is assumed, for example, that the number of stages of the treating units 221 is increased to six, and thus six (six stages of) treating units 221 are located in the up-down direction. In this case, four exhaust pipes 241 shown by dotted lines in FIG. 3 are additionally provided in the piping portion 294 in the treating unit 221 in the uppermost stage, and thus six exhaust pipes 241 in total are to be provided. Accordingly, the six exhaust pipes 241 serve a wall, and thus a passage for passing a pipe becomes narrower as shown by the numeral PT in FIG. 3, for example. Here, the pipe is provided for supplying the chemical to the substrate W held by the holding rotator 231.

In addition, as shown by the numerals A and B in FIG. 1, the currently-used substrate treating apparatus includes two types of treating units 221 although the same chemical treatment is performed. Accordingly, both components for the treating units 221 shown by the numeral A and components for the treating units 221 shown by the numeral B have to be prepared, leading to requirement of sharing of the components.

The present invention has been made regarding the state of the art noted above, and its one object is to provide a substrate treating apparatus that enables prevention of a passage for passing a pipe into a treatment chamber from being obstructed by an exhaust pipe and enables sharing of components.

Solution to Problem

To achieve the object, the present invention provides a configuration as follows. A substrate treating apparatus according to one aspect of the present invention includes a substrate transport mechanism configured to transport a substrate, and a plurality of treating units each configured to perform a predetermined chemical treatment to the substrate transported by the substrate transport mechanism. The plurality of treating units are located side by side along a transportation path of the substrate transport mechanism. Moreover, the plurality of treating units are located so as to face each other across the transportation path and so as to be laminated in an up-down direction. Moreover, the treating units each include a treatment chamber, a chemical piping portion, and an exhaust chamber. The treatment chamber is an area where a holding rotator configured to rotate the substrate while holding the substrate is provided, and the chemical treatment is performed to the substrate held and rotated by the holding rotator, and the substrate is delivered to and from the substrate transport mechanism via a substrate transportation port. The chemical piping portion is an area where a chemical pipe for supplying a chemical to the treatment chamber is located. The exhaust chamber is in communication with the treatment chamber via an exhaust port for exhausting gas from the treatment chamber, and is also in communication with an exhaust pipe extending in the up-down direction. All the treating units described above are arranged such that the treatment chamber, the chemical piping portion, and the exhaust chamber are located side by side along the transportation path, and the chemical piping portion is located on a first side of the treatment chamber and the exhaust chamber faces the chemical piping portion across the treatment chamber when seen from the transportation path.

In the substrate treating apparatus according to one aspect of the present invention, all the treating units are arranged such that the treatment chamber, the chemical piping portion, and the exhaust chamber are located side by side along the transportation path, and the chemical piping portion is located on the first side of the treatment chamber and the exhaust chamber faces the chemical piping portion across the treatment chamber when seen from the transportation path. The exhaust chamber faces the chemical piping portion across the treatment chamber, leading to prevention of obstruction of the passage for passing a pipe, configured to supply the chemical to the substrate held by the holding rotator, by the exhaust pipe. Moreover, all the treating units are located such that the chemical piping portion is located on the first side of the treatment chamber and the exhaust chamber faces the chemical piping portion across the treatment chamber when seen from the transportation path. Consequently, a single type of treating units is enough for the substrate treating apparatus instead of two types of treating units currently used. This results in sharing of components by all the treating units.

Moreover, it is preferred in the substrate treating apparatus described above that the exhaust chamber is in communication with a plurality of exhaust pipes extending in the up-down direction, and includes an opening and closing mechanism configured to switch an exhaust path of gas from the treatment chamber to one of the plurality of exhaust pipes.

The exhaust chamber is located laterally of the treatment chamber. Accordingly, the opening and closing mechanism can switch exhaust adjacent to the treatment chamber. This enhances switch responsiveness largely than the case where exhaust is switched at a position higher in level than the treating unit in the uppermost stage as in the state of the art. In addition, the exhaust chamber is located laterally of the treatment chamber, leading to suppression in height of the treating units. Moreover, the opening and closing mechanism can switch exhaust adjacent to the treatment chamber. Accordingly, the common exhaust pipe is located for the treating units laminated in one line in the up-down direction. Thus, the exhaust pipes lateral of the treatment chamber can be arranged in a compact manner.

It is preferred in the substrate treating apparatus described above that the treatment chamber further includes a liquid supplying unit configured to supply a chemical to the substrate held by the holding rotator, and that the opening and closing mechanism switches the exhaust path of the gas from the treatment chamber to a first exhaust pipe of the plurality of exhaust pipes when the liquid supplying unit supplies an acid chemical, switches the exhaust path of the gas from the treatment chamber to a second exhaust pipe of the plurality of exhaust pipes when the liquid supplying unit supplies an alkaline chemical, and switches the exhaust path of the gas from the treatment chamber to a third exhaust pipe of the plurality of exhaust pipes when the liquid supplying unit supplies an organic chemical.

Accordingly, the opening and closing mechanism can switch the exhaust from the treatment chamber to the first exhaust pipe, the second exhaust pipe, or the third exhaust pipe in accordance with the chemical of acid, alkaline, or organic, respectively, supplied from the liquid supplying unit.

Moreover, it is preferred in the substrate treating apparatus described above that the treatment chamber includes a lateral wall that faces the substrate transportation port across the holding rotator in plan view, the holding rotator is located more adjacent to the substrate transportation port than the lateral wall in the treatment chamber, the plurality of exhaust pipes are arranged in line in a horizontal direction perpendicular with respect to a direction where the transportation path extends, and the exhaust port of the exhaust chamber is located more adjacent to the transportation path than the plurality of exhaust pipes.

In the treatment chamber, the holding rotator tends to be located adjacent to the substrate transportation port. The exhaust port of the exhaust chamber is located more adjacent to the transportation path than the plurality of exhaust pipes. Accordingly, the exhaust port can approach the holding rotator while installation areas of the exhaust chamber and the exhaust pipes in plan view are made compact. This can supply vapor of the chemical around the holding rotator to the exhaust chamber relatively smoothly.

Moreover, it is preferred that the substrate treating apparatus described above further includes a horizontal exhaust pipe provided in a position higher in level than the plurality of treating units along the transportation path, and the horizontal exhaust pipe is in communication with each of the exhaust chambers of the treating units laminated in line in the up-down direction via the exhaust pipe. Since the opening and closing mechanism is provided in the exhaust chamber lateral of the treatment chamber in each of the treating units, the configuration of a connecting portion between the horizontal exhaust pipe and the exhaust pipes can be simplified.

Moreover, it is preferred in the substrate treating apparatus described above that the exhaust chamber includes a pressure adjustment mechanism provided adjacent to the exhaust port and configured to adjust pressure of gas passing through the exhaust port. Accordingly, the treating units can adjust exhaust pressure individually. For example, the exhaust pressure in the treating units can be adjusted more easily than the case where the exhaust from the treating units is collected and thereafter the pressure of the exhaust is adjusted collectively.

Moreover, it is preferred that the substrate treating apparatus described above further includes one or more substrate transport mechanisms, and the substrate transport mechanisms each transport substrates to a predetermined stage of a plurality of treating units of the treating units laminated in the up-down direction. Accordingly, the substrate transport mechanisms can share substrate transportation even when the number of stages of the treating units increases.

Advantageous Effects of Invention

The substrate treating apparatus according to the present invention enables prevention of the passage for passing the pipe into the treatment chamber from being obstructed by the exhaust pipe and also enables sharing of components.

BRIEF DESCRIPTION OF DRAWINGS

For the purpose of illustrating the invention, there are shown in the drawings several forms which are presently preferred, it being understood, however, that the invention is not limited to the precise arrangement and instrumentalities shown.

EMBODIMENTS

Figure 4:
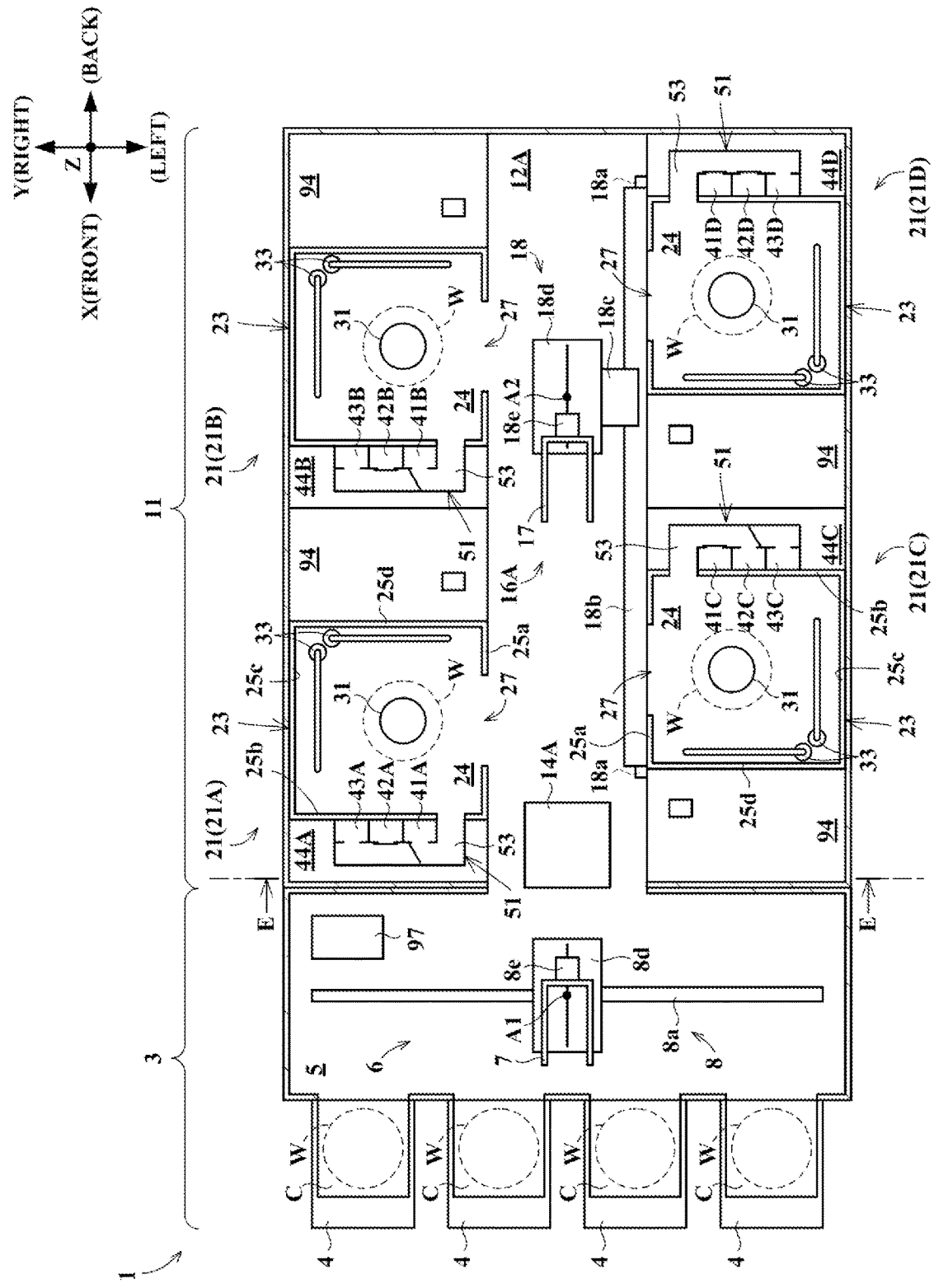
FIG. 4 is a transverse cross-sectional view of a substrate treating apparatus according to an embodiment.

The following describes embodiments of the present invention with reference to drawings. FIG. 4 is a transverse cross-sectional view of a substrate treating apparatus according to an embodiment.

Configuration of Substrate Treating Apparatus 1

A substrate treating apparatus 1 performs treatment to substrates (e.g., semiconductor wafers) W. The substrate W is a substantially circular and thin flat plate.

The substrate treating apparatus 1 includes an indexer 3, and a treating block 11. The treating block 11 is connected to the indexer 3. The indexer 3 and the treating block 11 align in a horizontal direction. The indexer 3 supplies a substrate W to the treating block 11. The treating block 11 performs a predetermined treatment on the substrate W. The indexer 3 collects the substrate W from the treating block 11.

In this specification, the horizontal direction in which the indexer 3 and the treating block 11 are arranged is referred to as a "front-back direction X" for convenience. One direction of the front-back direction X from the treating block 11 to the indexer 3 is referred to as a "forward direction". The direction opposite to the forward direction is referred to as a "rearward direction". A horizontal direction orthogonal to the front-back direction X is referred to as a "width direction Y". Moreover, one direction of the width direction Y is referred to as an "rightward direction", as appropriate. The direction opposite to the rightward direction is referred to as a "leftward direction". The perpendicular direction relative to the horizontal direction is referred to as a "vertical direction Z". For reference, the drawings show front, rear, right, left, up, and down, as appropriate. When no distinction is particularly made among "frontward", "rearward", "rightward", and "leftward", a simple term "lateral" is to be described.

1. Construction of Indexer 3

The indexer 3 includes a plurality of (e.g., four) carrier platforms 4. The carrier platforms 4 align in the width direction Y. The carrier platforms 4 each include one carrier C placed thereon. The carrier C accommodates a plurality of substrates W. The carrier C is, for example, a front opening unified pod (FOUP).

The indexer 3 includes a transportation space 5. The transportation space 5 is located behind the carrier platforms 4. The transportation space extends in the width direction Y.

The indexer 3 includes one or more transport mechanisms (e.g., one transport mechanism) 6. The transport mechanism 6 is also called an indexer mechanism. The transport mechanism 6 is located in a transportation space 5. The transport mechanism 6 is located behind the carrier platforms 4. The transport mechanism 6 transports substrates W. The transport mechanism 6 can access the carriers C placed on the carrier platforms 4, respectively.

Reference is made to FIG. 4. The following describes a configuration of the transport mechanism 6. The transport mechanism 6 includes a hand 7 and a hand driving unit 8. The hand 7 supports one substrate W in a horizontal posture. The hand driving unit 8 is coupled to the hand 7. The hand driving unit 8 moves the hand 7. The hand driving unit 8 moves the hand 7 in the front-back direction X, width direction Y, and vertical direction Z. The hand driving unit 8 includes a plurality of electric motors.

Figure 5:
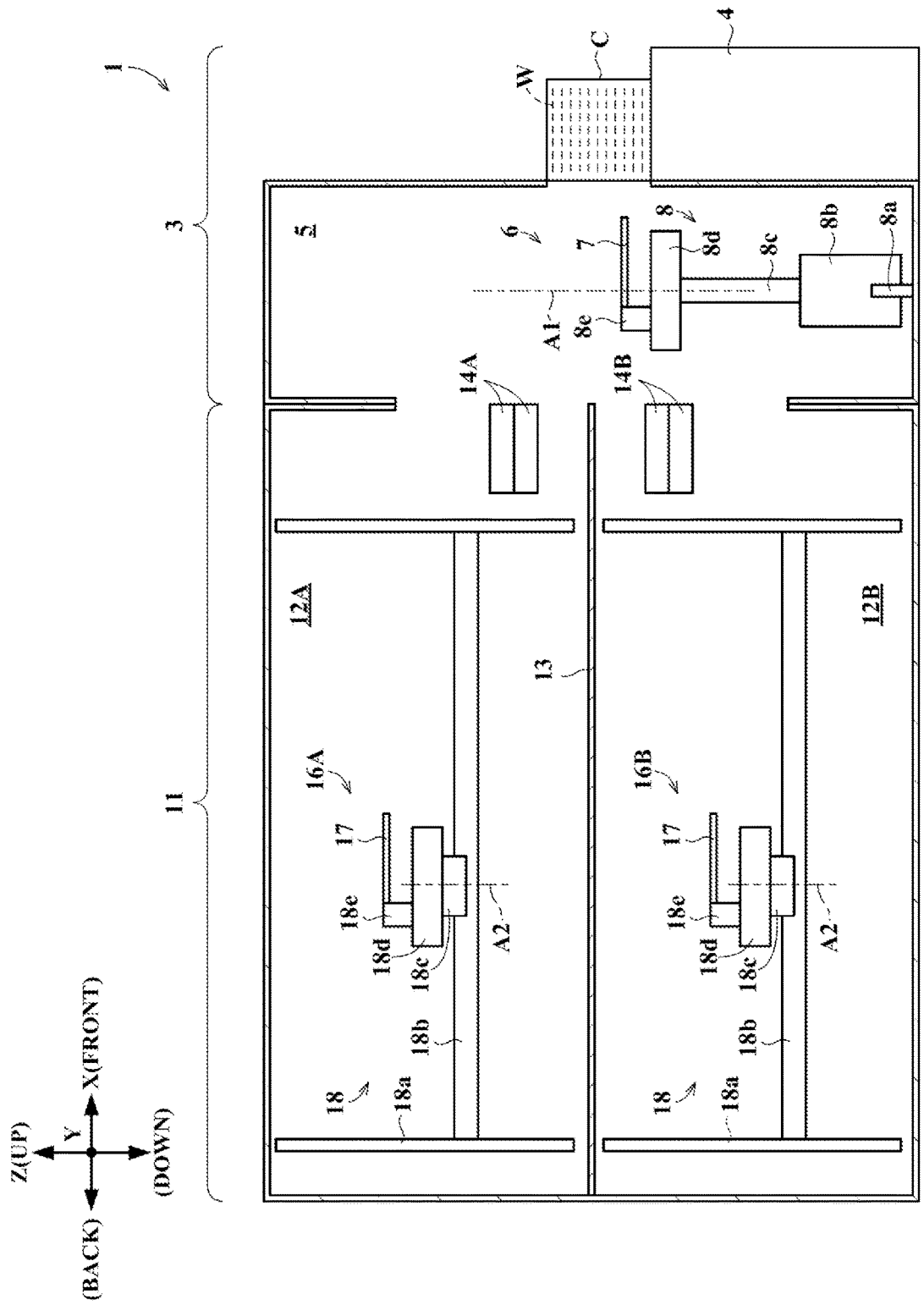
FIG. 5 is a longitudinal sectional view of the substrate treating apparatus in a front-back direction.

Reference is made to FIGS. 4 and 5. FIG. 5 is a longitudinal sectional view of the substrate treating apparatus 1 in the front-back direction X. The following describes a configuration of the hand driving unit 8. The hand driving unit 8 includes, for example, a rail 8a, a horizontally moving portion 8b, a vertically moving portion 8c, a rotator 8d, and an advancing/retreating portion 8e. The rail 8a is fixedly installed. The rail 8a is located at the bottom of the transportation space 5. The rail 8a extends in the width direction Y. The horizontally moving portion 8b is supported by the rail 8a. The horizontally moving portion 8b moves in the width direction Y with respect to the rail 8a. The vertically moving portion 8c is supported by the horizontally moving portion 8b. The vertically moving portion 8c moves in the vertical direction Z with respect to the horizontally moving portion 8b. The rotator 8d is supported by the vertically moving portion 8c. The rotator 8d rotates with respect to the vertically moving portion 8c. The rotator 8d rotates around a rotation axis A1. The rotation axis A1 is an imaginary line parallel to the vertical direction Z. The advancing/retreating portion 8e moves with respect to the rotator 8d. The advancing/retreating portion 8e reciprocates in a horizontal direction defined by the orientation of the rotator 8d. The advancing/retreating portion 8e is connected to the hand 7. Such a hand driving unit 8 can move the hand 7 in parallel in the vertical direction Z. The hand 7 is movable in a direction parallel to any horizontal direction. The hand 7 is rotatable around the rotation axis A1.

2. Construction of Treating Block 11

Reference is made to FIGS. 4 to 10 appropriately. The treating block 11 includes two transport mechanisms 16A and 16B and twenty-four (plural) treating units 21, for example. The twenty-four treating units 21 each perform a predetermined chemical treatment to a substrate W transported by either of the two transport mechanisms 16A and 16B. The twenty-four treating units 21 are located side by side along transportation paths (transportation spaces 12A and 12B) of the two substrate transport mechanisms 16A and 16B. Moreover, the twenty-four treating units 21 face each other across the transportation paths, and are also located so as to be laminated in the up-down direction. The following describes the detailed construction of the treating block 11.

Reference is made to FIG. 4. The treating block 11 includes the transportation space 12A. The transportation space 12A is located at the middle part of the treating block 11 in the width direction Y. The transportation space 12A extends in the front-back direction X. A front part of the transportation space 12A is in connection with a transportation space of the indexer 3.

The treating block 11 includes a substrate platform 14A. The substrate platform 14A is installed in the transportation space 12A. The substrate platform 14A is located in the front part of the transportation space 12A. The transport mechanism 6 of the indexer 3 is also accessible to the substrate platform 14A. The substrate platform 14A places one or more substrates W thereon.

The treating block 11 includes a transport mechanism 16A. The transport mechanism 16A is installed in the transportation space 12A. The transport mechanism 16A transports substrates W. The transport mechanism 16A is accessible to the substrate platform 14A.

As shown in FIG. 4, the treating block 11 includes four treating units 21A, 21B, 21C, and 21D. The treating units 21A and 21B are located rightward of the transportation space 12A. The treating units 21A and 21B align along the transportation space 12A in the front-back direction X. The treating unit 21B is located rearward of the treating unit 21A. The treating units 21C and 21D are located leftward of the transportation space 12A. The treating units 21C and 21D align along the transportation space 12A in the front-back direction X. The treating unit 21D is located rearward of the treating unit 21C. The two treating units 21A and 21B and the two treating units 21C and 21D are located so as to face each other across the transportation space 12A.

When no distinction is made among the treating units 21A, 21B, 21C, and 21D, they are referred to as a treating unit 21. The treating unit 21 performs a treatment to a substrate W.

Reference is made to FIG. 5. The treating block 11 includes a transportation space 12B in addition to the transportation space 12A. The transportation space 12B is located below the transportation space 12A. The transportation space 12B overlaps the transportation space 12A in plan view. The transportation space 12B has substantially the same shape as the transportation space 12A. The transportation space 12B is in connection with the transportation space 5 of the indexer 3. When no distinction is made between the transportation spaces 12A and 12B, they are referred to as a transportation space 12.

The treating block 11 includes one partition 13. The partition 13 is located below the transportation space 12A and above the transportation space 12B. The partition 13 has a flat plate shape. The partition 13 separates the transportation space 12A and the transportation space 12B.

The treating block 11 includes a substrate platform 14B in addition to the substrate platform 14A. The substrate platform 14B is installed in the transportation space 12B. The substrate platform 14B is located below the substrate platform 14A. The substrate platform 14B overlaps the substrate platform 14A in plan view. The substrate platform 14B is located at the same position as the substrate platform 14A in plan view. The substrate platform 14B is located forward of the transportation space 12B. The transport mechanism 6 of the indexer 3 is also accessible to the substrate platform 14B. The substrate platform 14B places one or more substrates W thereon.

The treating block 11 includes a transport mechanism 16B in addition to the transport mechanism 16A. The transport mechanism 16B is installed in the transportation space 12B. The transport mechanism 16B transports substrates W. The transport mechanism 16B is accessible to the substrate platform 14B.

The transport mechanism 16B has the same configuration as the transport mechanism 16A. When no distinction is made between the transport mechanisms 16A and 16B, they are referred to as a transport mechanism 16.

Reference is made to FIGS. 4 and 5. The transport mechanism 16 includes a hand 17 and a hand driving unit 18. The hand 17 supports one substrate W in a horizontal posture. The hand driving unit 18 is connected to the hand 17. The hand driving unit 18 moves the hand 17 in the front-back direction X, width direction Y, and vertical direction Z. The hand driving unit 18 includes a plurality of electric motors.

The following exemplarily describes a configuration of the hand driving unit 18. The hand driving unit 18 includes two struts 18a, a vertically moving portion 18b, a horizontally moving portion 18c, a rotator 18d, and an advancing/retreating portion 18e, for example.

The two struts 18a are fixedly installed. The two struts 18a are located on a lateral side of the transportation space 12. The two struts 18a align in the front-back direction X. The struts 18a each extend in the vertical direction Z. The vertically moving portion 18b is supported by the two struts 18a. The vertically moving portion 18b extends between the two struts 18a in the front-back direction X. The vertically moving portion 18b moves in the vertical direction Z with respect to the two struts 18a. The horizontally moving portion 18c is supported by the vertically moving portion 18b. The horizontally moving portion 18c moves in the front-back direction X with respect to the vertically moving portion 18b. The horizontally moving portion 18c extends between the two struts 18a in the front-back direction X. The rotator 18d is supported on the horizontally moving portion 18c. The rotator 18d rotates with respect to the horizontally moving portion 18c. The rotator 18d rotates around a rotation axis A2. The rotation axis A2 is an imaginary line parallel to the vertical direction Z.

The advancing/retreating portion 18e moves with respect to the rotator 18d. The advancing/retreating portion 18e reciprocates in a horizontal direction defined by the orientation of the rotator 18d. The advancing/retreating portion 18e is connected to the hand 17. Such a hand driving unit 18 can move the hand 17 in parallel in the vertical direction Z. The hand 17 is movable in parallel in any horizontal directions. The hand 17 is rotatable around the rotation axis A2.

Figure 6:
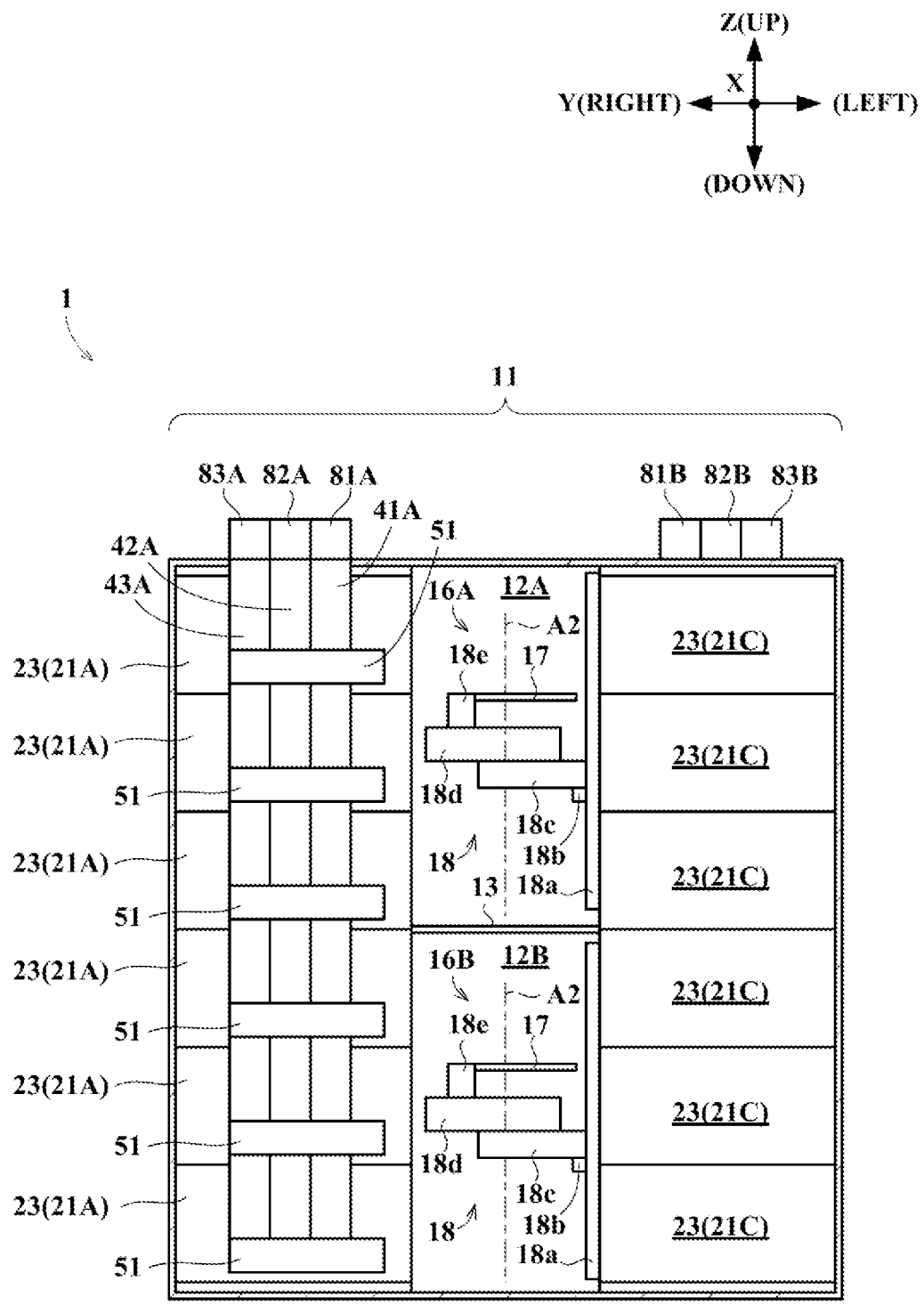
FIG. 6 is a longitudinal sectional view of the substrate treating apparatus seen from the arrow EE in FIG. 4.
Figure 7:
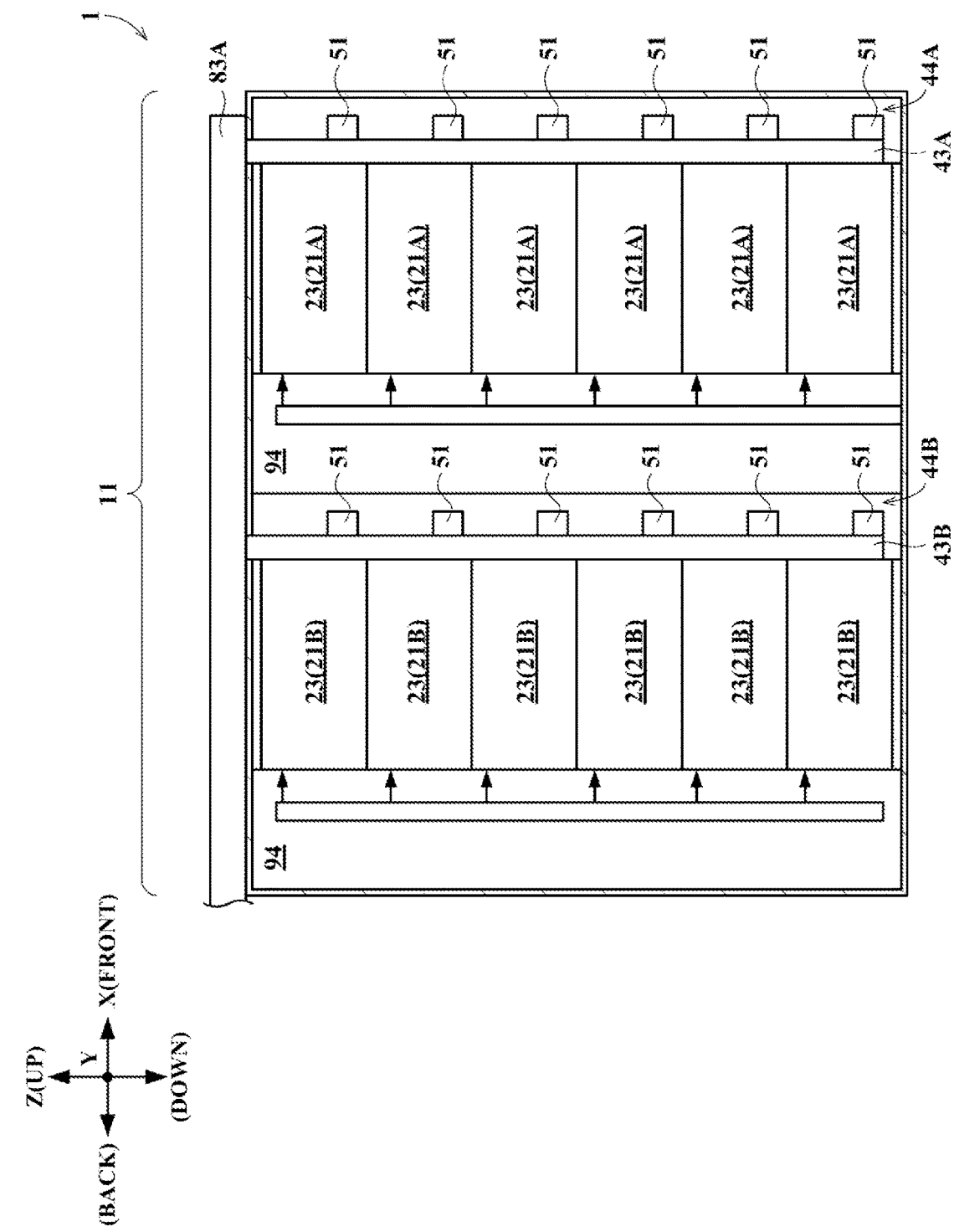
FIG. 7 is a right side view of a right portion of the substrate treating apparatus.
Figure 8:
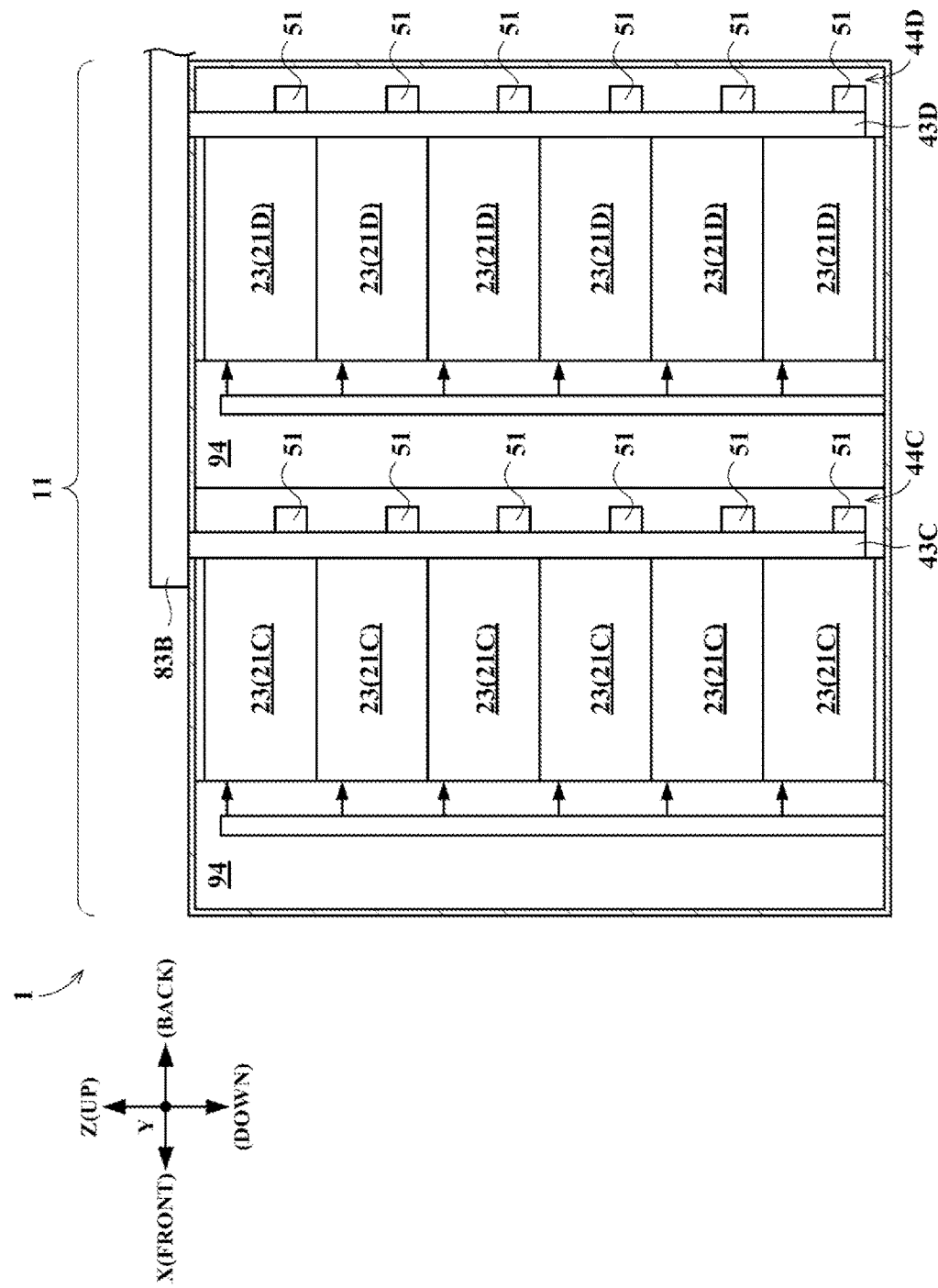
FIG. 8 is a left side view of a left portion of the substrate treating apparatus.

Reference is made to FIGS. 4 to 8. FIG. 7 is a right side view of a right part of the substrate treating apparatus 1. FIG. 8 is a left side view of a left part of the substrate treating apparatus 1. The treating block 11 includes six treating units 21A. The six treating units 21A are located so as to be laminated in the up-down direction. That is, the six treating units 21A align in line in the vertical direction Z. Likewise, the treating block 11 includes six treating units 21B, six treating units 21C, and six treating units 21D. The six treating units 21B, six treating units 21C, and six treating units 21D are each located so as to be laminated in the up-down direction.

The transport mechanism 16A in an upper layer in FIG. 5 transports substrates W to upper twelve (four×upper three stages) treating units 21. The transport mechanism 16B in a lower layer transports substrates W to lower twelve (four× lower three stages) treating units 21. Here, the transport mechanism 16 is accessible to holders 31 of the treating units 21.

2-1. Configuration of Treating Unit 21

Figure 9:
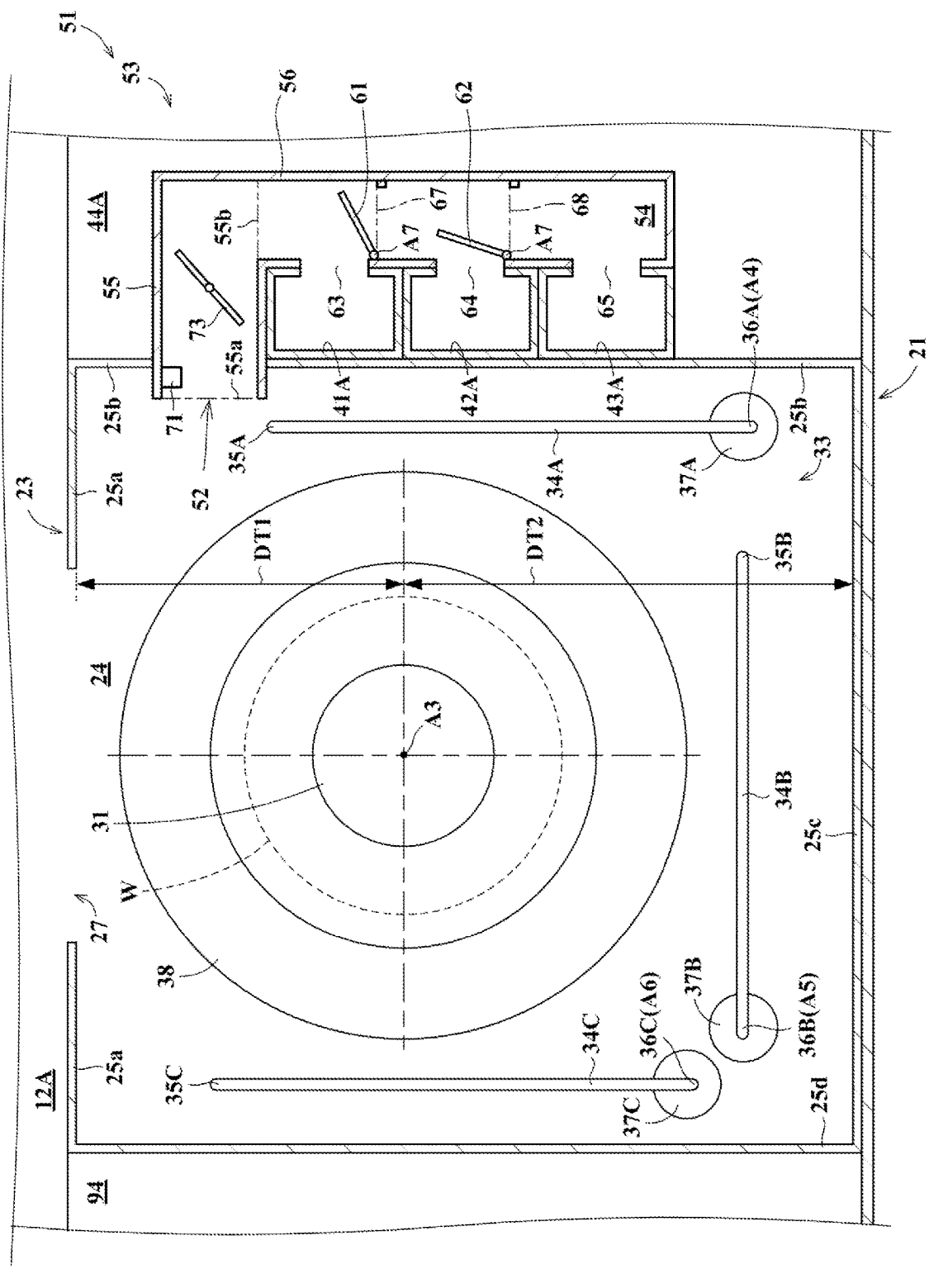
FIG. 9 is a transverse sectional view of the treating unit.

FIG. 9 is a transverse sectional view of the treating unit 21. The twenty-four treating units 21 each include a treatment chamber 23 (treating housing), a chemical piping space 94, and a switching mechanism 51.

The treatment chamber 23 includes a holder 31 therein configured to rotate while holding a substrate W, and is an area where a chemical treatment is performed to the substrate W held and rotated by the holder 31, and the substrate W is delivered to and from the transport mechanism 16 via the substrate transportation port 27. The chemical piping space 94 is an area where a chemical pipe for supplying a chemical to the treatment chamber 23 is located. The switching mechanism 51 (exhaust chamber 53) is in communication with the treatment chamber 23 via an exhaust port 52 for exhausting gas from the treatment chamber 23. Moreover, the switching mechanism 51 is also in communication with three exhaust pipes 41, 42, and 43 extending in the up-down direction.

When distinction is made to the exhaust pipe 41 among the treating units 21A to 21D, the exhaust pipe 41 is referred to as an exhaust pipe 41A, 41B, 41C, or 41D, respectively. This is similarly applicable to the exhaust pipes 42 and 43.

2-1-1. Configuration of Treatment Chamber 23

The following firstly describes the configuration of the treatment chamber 23. The treatment chamber 23 has a substantial box shape. The treatment chamber 23 is substantially rectangular in plan view, in front view, and in side view. The treatment chamber 23 includes therein a treating space 24. The treating unit 21 treats a substrate W in the treating space 24.

Reference is made to FIGS. 6 to 8. The six treatment chambers 23 in the six treating units 21A are laminated on one another. Likewise, the six treatment chambers 23 in the six treating units 21B are laminated on one another. The six treatment chambers 23 in the six treating units 21C are laminated on one another. The six treatment chambers 23 in the six treating units 21D are laminated on one another. The treatment chambers 23 are each adjacent to the transportation space 12.

Figure 10:
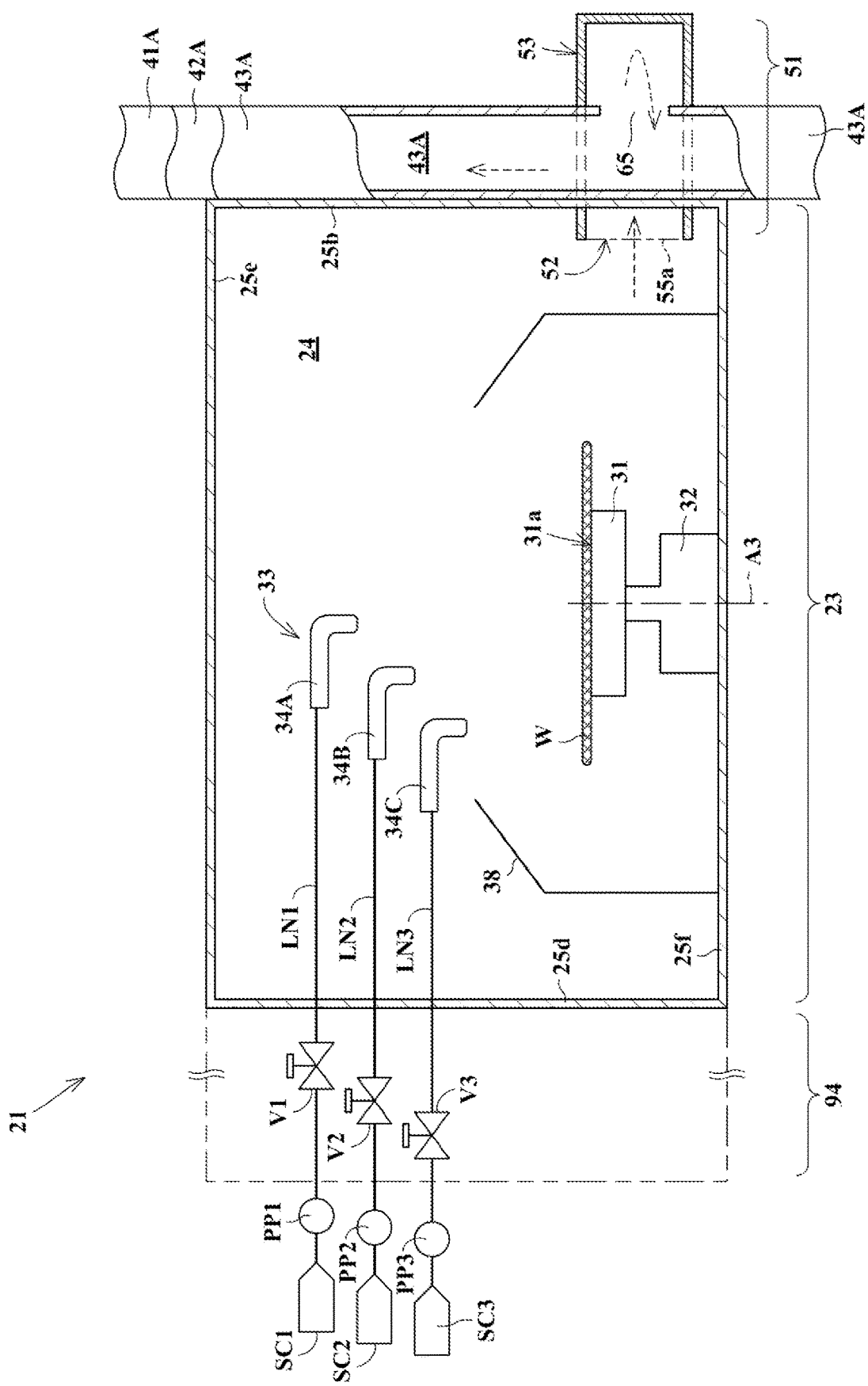
FIG. 10 is a diagram schematically illustrating a construction of a longitudinal sectional view of the treating unit.

Reference is made to FIGS. 9 and 10. The treatment chambers 23 each include four lateral walls 25a, 25b, 25c, and 25d, an upper board 25e, and a base board 25f. The lateral walls 25a to 25d each have a flat plate shape substantially vertical. The upper board 25e and the base board 25f each have a flat plate shape substantially horizontal. The treating spaces 24 are each defined by the lateral walls 25a to 25d, the upper board 25e, and the base board 25f.

The lateral walls 25a and 25c extend in the front-back direction X. The lateral wall 25c is provided so as to face the lateral wall 25a. The lateral walls 25b and 25d extend in the width direction Y. The lateral walls 25b and 25d each extend from the lateral wall 25a to the lateral wall 25c. The lateral wall 25d is provided so as to face the lateral wall 25b.

The lateral wall 25a is positioned so as to contact the transportation space 12. As for the treating units 21A and 21B, the lateral wall 25c is positioned rightward of the lateral wall 25a, and the lateral wall 25d is positioned rearward of the lateral wall 25b, as shown in FIG. 4. As for the treating units 21C and 21D, the lateral wall 25c is positioned leftward of the lateral wall 25a, and the lateral wall 25d is positioned forward of the lateral wall 25b.

The treatment chamber 23 has the substrate transportation port 27. The substrate transportation port 27 is formed in the lateral wall 25a. A substrate W can pass through the substrate transportation port 27. The substrate W moves between outside of the treatment chamber 23 (i.e., transportation space 12) and inside of the treatment chamber 23 (i.e., treating space 24) via the substrate transportation port 27. The treating units 21 each have a shutter, not shown. The shutter is attached to the lateral wall 25a. The shutter opens and closes the substrate transportation port 27.

The treatment chamber 23 includes the holder 31. The holder 31 is installed inside of the treatment chamber 23. The holder 31 holds one substrate W horizontally. The holder 31 includes a top face 31a. The top face 31a is substantially horizontal. The substrate W is placed on the top face 31a. The holder 31 may hold a lower face of the substrate W by vacuum adsorption, for example. Moreover, the holder 31 may include a spin base, and three or more support pins standing on the spin base. In this case, the three or more support pins sandwich a side face of the substrate W for holding the substrate W while keeping a clearance between the spin base and the substrate W. Here, FIG. 4 shows the substrate W held by the holder 31 by dotted lines.

The treating units 21 each further includes a rotation driving unit 32. The rotation driving unit 32 is installed inside of the treatment chamber 23. The rotation driving unit 32 is connected to the substrate holder 31. The rotation driving unit 32 includes an electric motor, for example, and causes the holder 31 to rotate. The substrate W held by the holder 31 rotates integrally with the holder 31. The substrate W is rotated around a rotation axis A3. The rotation axis A3 is an imaginary line parallel to the vertical direction Z. The rotation axis A3 passes through the center of the substrate W.

Figure 1:
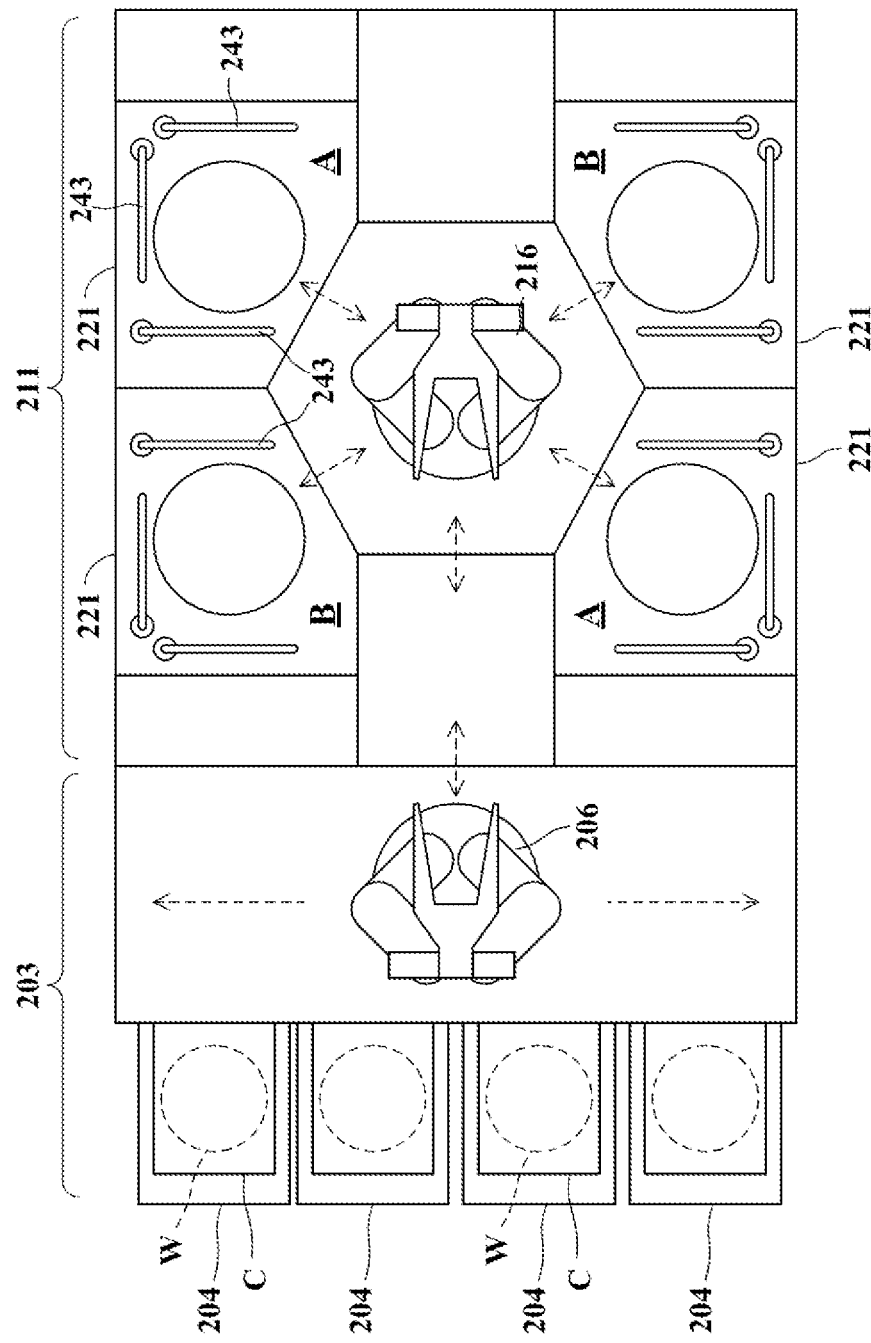
FIG. 1 is a plan view of a currently-used substrate treating apparatus.

Here, the currently-used substrate treating apparatus shown in FIG. 1 includes two types of treating units 221 (A and B). In the treating units 221, arrangement and the like of nozzles 243 are provided symmetrically. In this case, in order to perform a chemical treatment in the same manner in the two types of the treating units, the holders in one type of the treating units are rotated counterclockwise in plan view whereas the holders in the other type of the treating units are rotated clockwise. In this embodiment, the rotation driving unit 32 rotates the holders 31 only in a predetermined direction (e.g., counterclockwise) in plan view.

Reference is made to FIG. 4. The treatment chamber 23 includes a liquid supplying unit 33. The liquid supplying unit 33 is installed inside of the treatment chamber 23. The liquid supplying unit 33 supplies a chemical (also referred to as a treating liquid) to the substrate W held by the holder 31. The liquid supplying unit 33 supplies a first chemical, a second chemical, and a third chemical. The first chemical, the second chemical, and the third chemical differ from one another in type.

The first chemical is classified to an acid liquid (acid chemical), for example. The first chemical includes, for example, at least one selected from hydrofluoric acid, a hydrochloric acid/hydrogen peroxide solution, sulfuric acid, a sulfuric acid/hydrogen peroxide solution, fluoro-nitric acid (a mixed liquid of hydrofluoric acid and nitric acid), and hydrochloric acid.

The second chemical is classified to an alkaline liquid (alkaline chemical), for example. The second chemical includes, for example, at least one selected from ammonia/ hydrogen peroxide solution (SC1), an ammonia water, an ammonium fluoride solution, and tetramethylammonium hydroxide (TMAH).

The third chemical is classified to an organic liquid (organic chemical), for example. The organic liquid includes at least one selected from isopropyl alcohol (IPA), methanol, ethanol, hydrofluoroether (HFE), and acetone.

Reference is made to FIG. 9. The liquid supplying unit 33 includes one or more (e.g., three) nozzles 34A, 34B, and 34C. The nozzles 34A, 34B, and 34C each dispense a chemical. The nozzle 34A dispenses the first chemical, for example. The nozzle 34B dispenses the second chemical, for example. The nozzle 34C dispenses the third chemical, for example. Here, the liquid supplying unit 33 may include an additional nozzle to dispense inert gas, such as nitrogen, or may dispense a mixed liquid of inert gas and the chemical.

The nozzles 34A, 34B, and 34C each have a tubular shape extending linearly. The nozzles 34A, 34B, and 34C include distal ends 35A, 35B, and 35C, and proximal ends 36A, 36B, and 36C, respectively. The distal ends 35A, 35B, and 35C each include an outlet, not shown, through which the chemical is discharged.

The liquid supplying unit 33 includes one or more (e.g., three) bases 37A, 37B, and 37C. The bases 37A, 37B, and 37C support the nozzles 34A, 34B, and 34C, respectively. Specifically, the bases 37A, 37B, and 37C are connected to the proximal ends 36A, 36B, and 36C, respectively.

The base 37A moves the nozzle 34A between a treating position and a retracting position. When the nozzle 34A is in the treating position, the distal end 35A (outlet) is positioned above the substrate W held by the holder 31. When the nozzle 34A is in the treating position, the distal end 35A (outlet) overlaps the substrate W held by the holder 31 in plan view. When the nozzle 34A is in the retreating position, the nozzle 34A does not overlap the substrate W held by the holder 31 in plan view entirely. Likewise, the bases 37B and 37C move the nozzles 34B and 34C, respectively, between a treating position and a retracting position. The bases 37A, 37B, and 37C each include an electric motor.

Specifically, the base 37A rotates the nozzle 34A around a rotation axis A4. The rotation axis A4 is an imaginary line parallel to the vertical direction Z. The rotation axis A4 passes through the base 37A. Likewise, the bases 37B and 37C rotate the nozzles 34B and 34C around rotation axes A5 and A6, respectively. The rotation axes A5 and A6 are each an imaginary line parallel to the vertical direction Z. The rotation axes A5 and A6 pass through the bases 37B and 37C, respectively.

The base 37A is located at a corner where the lateral walls 25b and 25c are connected. The bases 37B and 37C are each located at a corner where the lateral walls 25c and 25d are connected.

The substrate transportation port 27 and the nozzles 34A, 34B, and 34C are located so as to surround the holder 31 in plan view. When the nozzles 34A, 34B, and 34C are in a standby position outward of the substrate W, the substrate transportation port 27 and the nozzle 34B are located so as to face each other across the holder 31. Moreover, the nozzles 34A and 34C are located so as to face each other across the holder 31. The treating units 21 each include a cup 38 around the holder 31. The cup 38 receives the chemical scattered from the substrate W during the chemical treatment.

Reference is made to FIG. 10. The first nozzle 34A is connected to a supplying source SC1 via a pipe LN1. An on-off valve V1 and a pump PP1 are provided on the pipe LN1. The on-off valve V1 performs supply of a chemical from the supplying source SC1 to the first nozzle 34A, and stops the supply of the chemical. Likewise, the second nozzle 34B is connected to a supplying source SC2 via a pipe LN2. An on-off valve V2 and a pump PP2 are provided on the pipe LN2. The on-off valve V2 performs supply of a chemical from the supplying source SC2 to the second nozzle 34B, and stops the supply of the chemical. Moreover, the third nozzle 34C is connected to a supplying source SC3 via a pipe LN3. An on-off valve V3 and a pump PP3 are provided on the pipe LN3. The on-off valve V3 performs supply of a chemical from the supplying source SC3 to the third nozzle 34C, and stops the supply of the chemical. The three pumps PP1 to PP3 each feed out the chemical.

2-1-2. Configuration of Chemical Piping Space 94

The chemical piping space 94 is an area where three chemical pipes LN1, LN2, and LN3 for supplying the chemical to the treatment chamber 23 are located. That is, the chemical piping space 94 includes the three pipes LN1 to LN3, and the three on-off valves V1, V2, and V3. Moreover, the three pipes LN1 to LN3 may each be provided with at least either a flow rate regulating valve or a flow meter in addition to the on-off valve V1 (or V2 or V3). Here, the three pipes LN1 to LN3 are pulled from the chemical piping space 94 to the treatment chamber 23, and are connected to the nozzles 34A to 34C, respectively.

2-1-3. Configuration of Switching Mechanism 51 (Exhaust Configuration of Treating Unit 21)

Reference is made to FIG. 4. The treating block 11 includes three exhaust pipes 41, 42, 43 in each of the treating units 21. The exhaust pipes 41, 42, and 43 are all installed outside of the treatment chamber 23. The exhaust pipes 41 to 43 are each installed on a lateral side of the treatment chamber 23. The exhaust pipes 41 to 43 each pass laterally of the treatment chamber 23. The exhaust pipes 41 to 43 each exhaust gas from the treatment chamber 23.

The treating unit 21 includes the switching mechanism 51. The switching mechanism 51 is located laterally of the treatment chamber 23. That is, the switching mechanism 51 is located at substantially the same level as that of the treatment chamber 23. The switching mechanism 51 is in communication with the treatment chamber 23 via the exhaust port 52 (see FIG. 9), and also in communication with each of the three exhaust pipes 41 to 43. The switching mechanism 51 switches the exhaust path of gas from the treatment chamber 23 to one of the three exhaust pipes 41 to 43.

As shown in FIG. 4, the treating block 11 includes four exhaust pipe spaces 44 (44A, 44B, 44C, 44D). In the two treating units 21A and 21B, the exhaust pipe space 44, the treatment chamber 23, and the chemical piping space 94 align side by side in this order from a side adjacent to the indexer 3. The exhaust pipe space 44 is adjacent to the treatment chamber 23, and the treatment chamber 23 is adjacent to the chemical piping space 94. Moreover, in the two treating units 21C and 21D, the chemical piping space 94, the treatment chamber 23, and the exhaust pipe space 44 align side by side in this order from the side adjacent to the indexer 3.

The four exhaust pipe spaces 44 each extend in the vertical direction Z. The four exhaust pipe spaces 44 each extend from a treating unit 21 in the lowermost stage (first stage) to a treating unit 21 in the uppermost stage (sixth stage). The four exhaust pipe spaces 44 each accommodate three exhaust pipes 41 to 43. The three exhaust pipes 41 to 43 align in the width direction Y.

FIG. 6 is a longitudinal sectional view of the substrate treating apparatus 1 seen from the arrow EE in FIG. 4. The three exhaust pipes 41 to 43 each extend from a position same in level as the treating unit 21 in the lowermost stage (first stage) to a position same in level as the treating unit 21 in the uppermost stage (sixth stage). The three exhaust pipes 41 to 43 contact the treatment chambers 23 of the treating units 21 in six stages laminated in the up-down direction. The three exhaust pipes 41 to 43 individually exhaust gas from the treatment chambers 23 of the treating units 21 in six stages laminated in the up-down direction. That is, there are four pairs of three exhaust pipes 41 to 43. A first pair of three exhaust pipes 41A to 43A are configured to exhaust gas from the treating units 21A in six stages. A second pair of three exhaust pipes 41B to 43B are configured to exhaust gas from the treating units 21B in six stages. Likewise, a third pair of three exhaust pipes 41C to 43C are configured to serve exhaust gas from of the treating units 21C in six stages, and a fourth pair of three exhaust pipes 41D to 43D are configured to serve exhaust of the treating units 21D in six stages.

As shown in FIGS. 6 to 8, the switching mechanism 51 is located at substantially the same position in level as that of the treatment chamber 23. The switching mechanism 51 is positioned so as not to overlap the holder 31 and the treatment chamber 23 in plan view. The switching mechanism 51 is located outside of the treatment chamber 23. As shown in FIG. 4, the switching mechanism 51 is located in each of the four exhaust pipe spaces 44 (44A, 44B, 44C, 44D).

Reference is made to FIG. 9. The following describes a configuration of the switching mechanism 51. The switching mechanism 51 includes an exhaust chamber (switching housing) 53. The exhaust chamber 53 is communicatively connected to the treatment chamber 23. The exhaust chamber 53 is also communicatively connected to the exhaust pipes 41 to 43. The exhaust chamber 53 includes therein a switching space 54 as an exhaust path.

The exhaust chamber 53 extends in the horizontal direction. The exhaust chamber 53 and the switching space 54 bend in substantially an L-shape in plan view. The exhaust chamber 53 includes an introducing portion 55 and a distributing portion 56. The introducing portion 55 is communicatively connected to the treatment chamber 23. The introducing portion 55 is connected to a lateral wall 25b of the treatment chamber 23. The introducing portion 55 extends from the treatment chamber 23 in the front-back direction X, and is shaped rectangular in plan view.

The introducing portion 55 is communicatively connected to the treatment chamber 23. The introducing portion 55 has a first end 55a and a second end 55b. The first end 55a is located inside of the treatment chamber 23 (i.e., treating space 24). An opening of the first end 55a forms an exhaust port 52. The second end 55b is located outside of the treatment chamber 23 (i.e., exhaust pipe space 44).

The distributing portion 56 is connected to the introducing portion 55. The distributing portion 56 extends in the width direction Y, and is shaped rectangular in plan view. The distributing portion 56 is also communicatively connected to the exhaust pipes 41 to 43. The distributing portion 56 is connected to outer faces of the exhaust pipes 41 to 43.

The distributing portion 56 is located outside of the treatment chamber 23 (i.e., exhaust pipe space 44). The distributing portion 56 is located adjacent to the exhaust pipes 41 to 43. The exhaust pipes 41 to 43 are located between the lateral wall 25b and the distributing portion 56.

The exhaust chamber 53 is in communication with the treatment chamber 23. That is, the switching space 54 is in communication with the treating space 24. The switching space 54 is opened at the first end 55a to the treating space 24. The exhaust chamber 53 is also in communication with the exhaust pipes 41 to 43. That is, the switching space 54 is in communication with the exhaust pipes 41 to 43 by the distributing portion 56.

The exhaust chamber 53 includes two opening and closing portions 61 and 62, three communication channels 63, 64, and 65, and two distributing openings 67 and 68. The opening and closing portions 61 and 62 are located inside of the exhaust chamber 53. A first communication channel 63 is brought into communication between the distributing portion 56 and a first exhaust pipe 41. A second communication channel 64 is brought into communication between the distributing portion 56 and a second exhaust pipe 42. A third communication channel 65 is brought into communication between the distributing portion 56 and a third exhaust pipe 43. A first distributing opening 67 is formed between the two communication channels 63 and 64 so as to block the distributing portion 56 extending in an Y-direction. A second distributing opening 68 is formed between the two communication channels 64 and 65 so as to block the distributing portion 56 extending in the Y-direction.

The opening and closing portion 61 has a flat plate shape substantially vertical, for example. The opening and closing portion 61 is installed around a rotation axis A7 in a swingable manner. The rotation axis A7 is an imaginary line parallel to the up-down direction Z. The rotation axis A7 passes through one end of the opening and closing portion 61. The opening and closing portion 61 is driven by an electric motor, for example. The opening and closing portion 62 has the same configuration as that of the opening and closing portion 61.

Figure 11A:
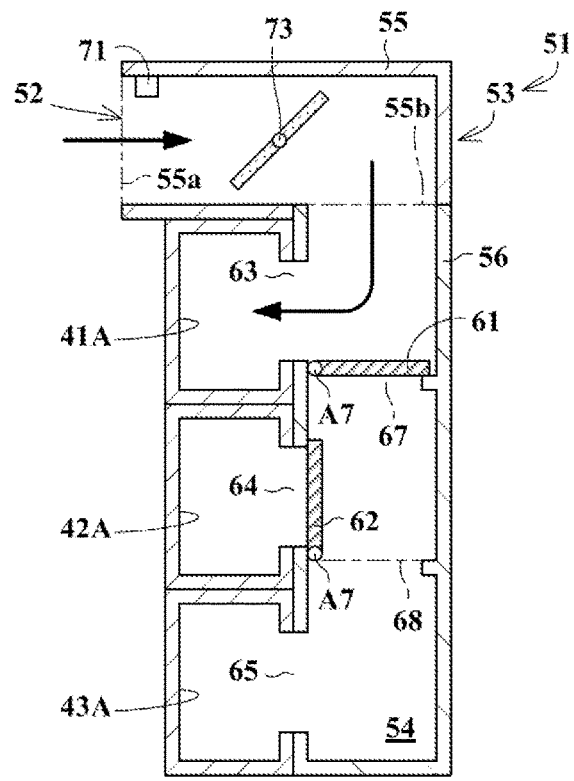
FIGS. 11A to 11C illustrate switching operation relative to three exhaust pipes.
Figure 11B:
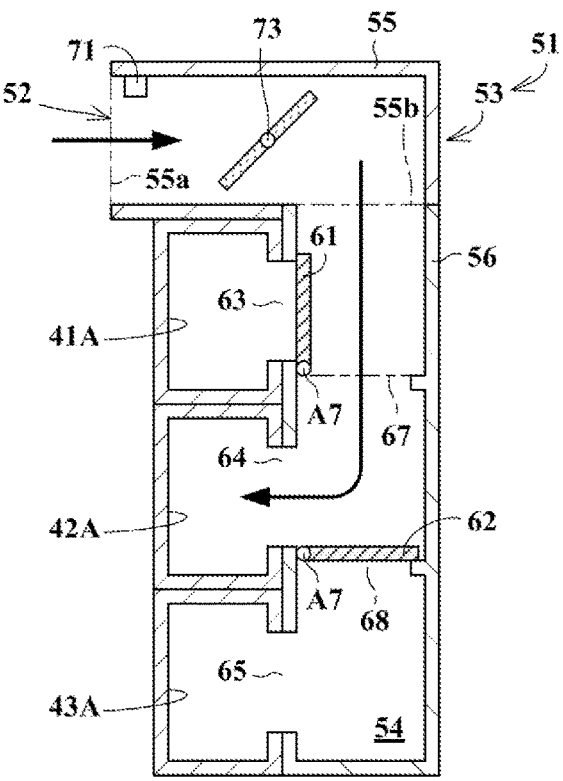
Figure 11C:
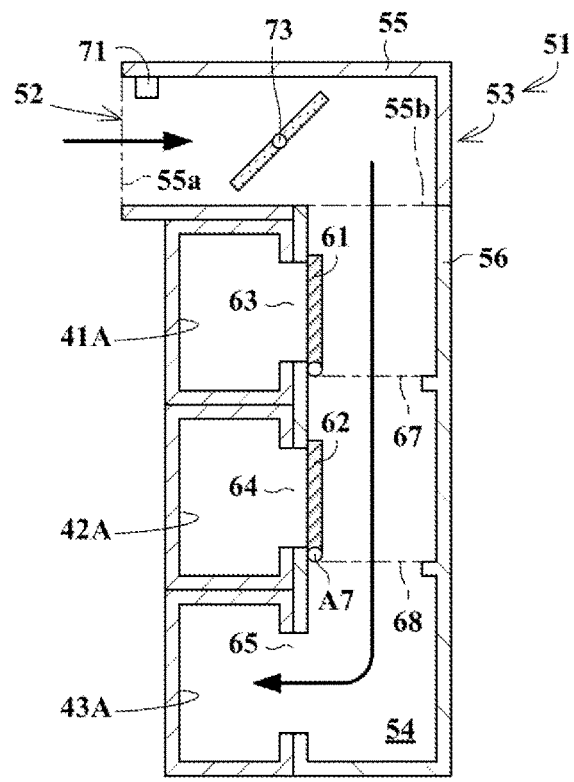

The opening and closing portions 61 and 62 operate independently. The opening and closing portion 61 closes either the first communication channel 63 or the distributing opening 67. The opening and closing portion 62 closes either the second communication channel 64 or the distributing opening 68. Reference is made to FIG. 11A. For example, when the opening and closing portion 61 closes the distributing opening 67, gas from the treatment chamber 23 is fed to the exhaust pipe 41 through the first communication channel 63 regardless of the position of the opening and closing portion 62. Reference is made to FIG. 11B. When the opening and closing portion 61 closes the first communication channel 63 and the opening and closing portion 62 closes the distributing opening 68, gas from the treatment chamber 23 is fed to the exhaust pipe 42 through the second communication channel 64. Reference is made to FIG. 11C. When the opening and closing portion 61 closes the first communication channel 63 and the opening and closing portion 62 closes the second communication channel 64, gas from the treatment chamber 23 is fed to the exhaust pipe 43 through the third communication channel 65.

Reference is made again to FIG. 9. The switching mechanism 51 includes a pressure sensor 71 and a pressure adjustment mechanism 73. The pressure sensor 71 detects pressure of exhaust as gas to be exhausted. The pressure adjustment mechanism 73 adjusts pressure of gas passing through the exhaust port 52. The pressure adjustment mechanism 73 performs adjustment to be predetermined pressure in accordance with the pressure determined by the pressure sensor 71. The pressure sensor 71 and the pressure adjustment mechanism 73 are installed inside of the introducing portion 55. The pressure adjustment mechanism 73 is provided between the exhaust port 52 and the distributing portion 56 (i.e., two opening and closing portions 61 and 62) and adjacent to the exhaust port 52, for example. The pressure sensor 71 is provided between the exhaust port 52 and the pressure adjustment mechanism 73. Here, the pressure sensor 71 may be provided on a secondary side (downstream side) of the pressure adjustment mechanism 73.

The pressure adjustment mechanism 73 is formed with either an automatic damper (motor damper) or a fan, for example. The automatic damper includes a vane member (plate member) for changing a channel sectional area, and adjusts an airflow volume (ventilation volume (volume/time)) within the introducing portion 55. The automatic damper and the fan each include an electric motor.

Figure 12:
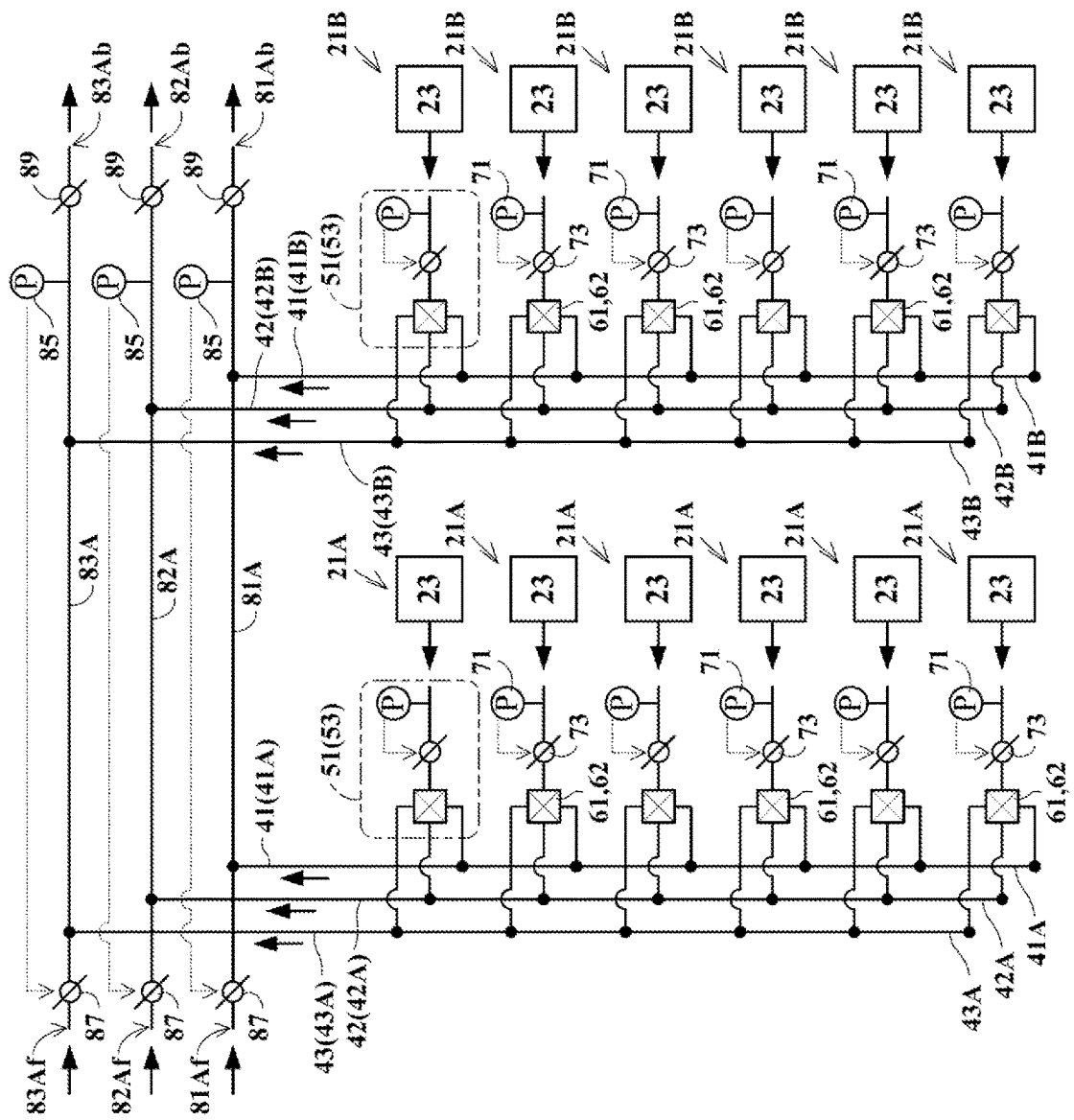
FIG. 12 is a piping diagram of an exhaust configuration of the substrate treating apparatus.

Reference is made to FIG. 12. The pressure sensor 71 and the pressure adjustment mechanism 73 are provided in each of the treating units 21. Accordingly, exhaust pressure (airflow volume) can be adjusted easily for the treating units 21 individually.

Figure 13:
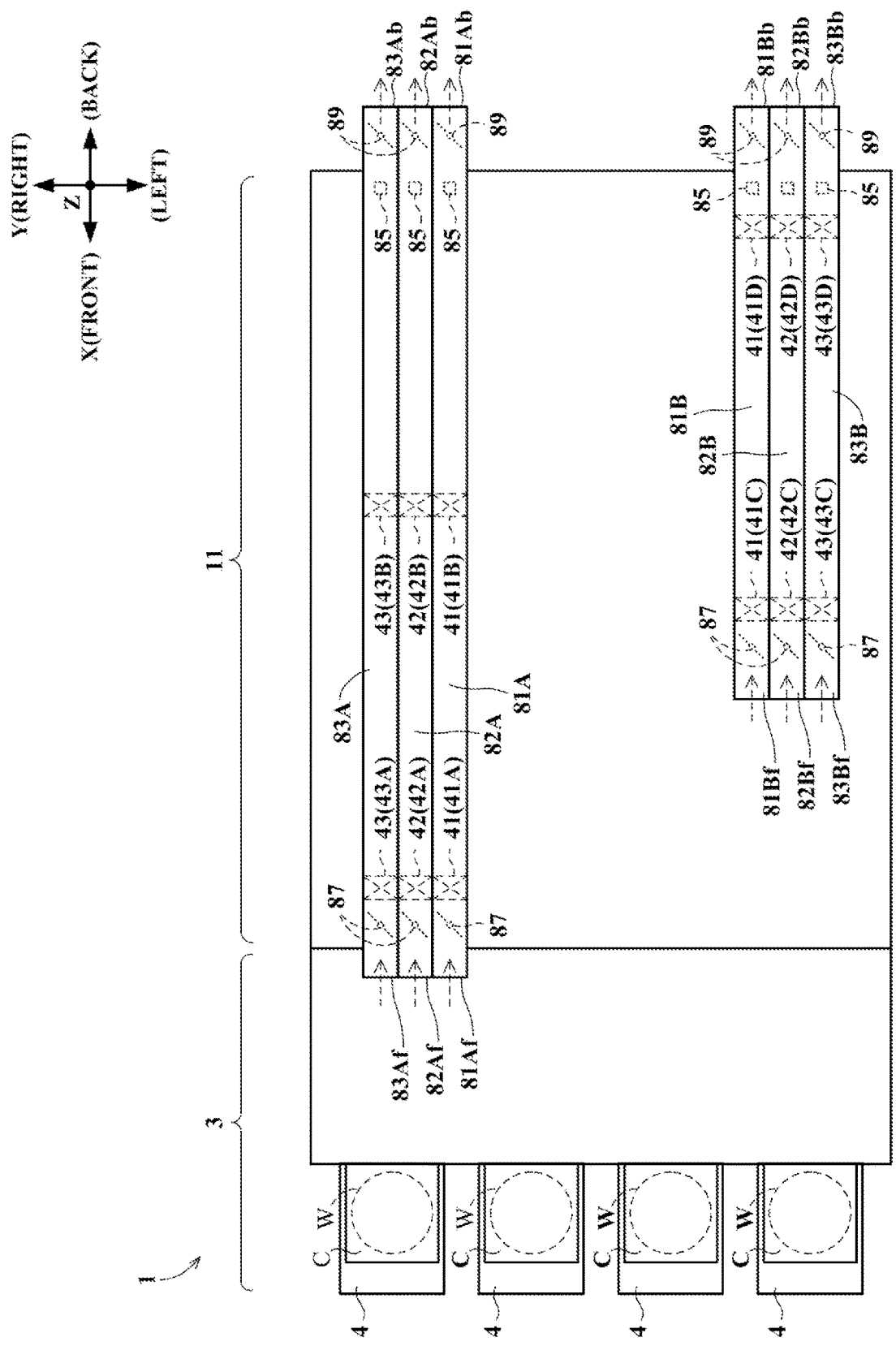
FIG. 13 is a plan view of a horizontal exhaust pipe of the substrate treating apparatus.

Reference is made to FIGS. 6 and 13. The treating block 11 includes three horizontal exhaust pipes 81A, 82A, and 83A. The three horizontal exhaust pipes 81A to 83A are positioned higher than the two treating units 21A and 21B in the uppermost stage (sixth stage). That is, the three horizontal exhaust pipes 81A to 83A are positioned higher than the six-staged treating units 21A and the six-staged treating units 21B. The three horizontal exhaust pipes 81A to 83A are located so as to extend in the front-back direction (X-direction) along the transportation space 12. Moreover, the three horizontal exhaust pipes 81A to 83A align side by side in the width direction (Y-direction).

The first horizontal exhaust pipe 81A is communicatively connected to the exhaust pipe 41 (41A) for the treating unit 21A and the exhaust pipe 41 (41B) for the treating unit 21B. Likewise, the second horizontal exhaust pipe 82A is communicatively connected to the exhaust pipe 42 (42A) for the treating unit 21A and the exhaust pipe 42 (42B) for the treating unit 21B successively. The third horizontal exhaust pipe 83A is communicatively connected to the exhaust pipe 43 (43A) for the treating unit 21A and the exhaust pipe 43 (43B) for the treating unit 21B successively. The three horizontal exhaust pipes 81A to 83A are each positioned so as to overlap the treatment layers 23 of the treating units 21A and 21B in plan view.

The horizontal exhaust pipe 81A exhausts gas from the exhaust pipes 41A and 41B. The horizontal exhaust pipe 82A exhausts gas from the exhaust pipes 42A and 42B. The horizontal exhaust pipe 83A exhausts gas from the exhaust pipes 43A and 43B.

The treating block 11 includes horizontal exhaust pipes 81B, 82B, and 83B. The three horizontal exhaust pipes 81B, 82B, and 83B are configured in substantially the same manner as that of the three horizontal exhaust pipes 81A to 83A, respectively. The three horizontal exhaust pipes 81B to 83B are positioned higher than the two treating units 21C and 21D in the uppermost stage (sixth stage). The three horizontal exhaust pipes 81B to 83B are located so as to extend in the front-back direction X along the transportation space 12.

The fourth horizontal exhaust pipe 81B is communicatively connected to the exhaust pipe 41 (41C) for the treating unit 21C and the exhaust pipe 41 (41D) for the treating unit 21D successively. Likewise, the fifth horizontal exhaust pipe 82B is communicatively connected to the exhaust pipe 42 (42C) for the treating unit 21C and the exhaust pipe 42 (42D) for the treating unit 21D successively. The sixth horizontal exhaust pipe 83B is communicatively connected to the exhaust pipe 43 (43C) for the treating unit 21C and the exhaust pipe 43 (43D) for the treating unit 21D successively. Moreover, the three horizontal exhaust pipes 81B to 83B align side by side in the width direction Y. For example, the horizontal exhaust pipe 81B exhausts gas from the exhaust pipes 41C and 41D.

The three horizontal exhaust pipes 81A to 83A are configured so as to be longer than the three horizontal exhaust pipes 81B to 83B, respectively. The horizontal exhaust pipes 81A, 82A, and 83A have front ends 81Af, 82Af, and 83Af, respectively. The horizontal exhaust pipes 81B, 82B, and 83B have front ends 81Bf, 82Bf, and 83Bf, respectively. The front end 81Af is located more forward than the front ends 81Bf, 82Bf, and 83Bf. Likewise, the front ends 82Af and 83Af are each located more forward than the front ends 81Bf, 82Bf, and 83Bf.

The six front ends 81Af to 83Af and 81Bf and 83Bf are opened to the outside of the substrate treating apparatus 1 (e.g., a clean room where the substrate treating apparatus 1 is installed). The six horizontal exhaust pipes 81A to 83A and 81B and 83B can each take outside air from the six front ends 81Af to 83Af, and 81Bf to 83Bf, respectively.

Gas flows rearward within the horizontal exhaust pipe 81A. Likewise, gas flows rearward within the five horizontal exhaust pipes 82A, 83A, and 81B to 83B. The horizontal exhaust pipes 81A, 82A, and 83A have rear ends 81Ab, 82Ab, and 83Ab, respectively. The horizontal exhaust pipes 81B, 82B, and 83B have rear ends 81Bb, 82Bb, and 83Bb, respectively. The six rear ends 81Ab to 83Ab, and 81Bb to 83Bb are connected to an exhaust facility in a factory, for example. In the exhaust facility in the factory, gas within the six horizontal exhaust pipes 81A to 83A and 81B to 83B are sucked through the six rear ends 81Ab to 83Ab and 81Bb to 83Bb at predetermined pressure.

The treating block 11 includes six pressure sensors 85, six front pressure adjustment mechanisms 87, and six rear pressure adjustment mechanisms 89. That is, the six horizontal exhaust pipes 81A to 83A and 81B to 83B are each provided with the pressure sensor 85, the front pressure adjustment mechanism 87, and the rear pressure adjustment mechanism 89.

Reference is made to FIG. 13. The following describes the horizontal exhaust pipe 81A as one example. The front pressure adjustment mechanism 87 is located between the front end 81Af and a connecting portion to the exhaust pipe 41A. Moreover, the pressure adjustment mechanism 87 may be located more adjacent to the front end 81Af than the connecting portion to the exhaust pipe 41A. The pressure adjustment mechanism 87 adjusts pressure of outside air (airflow volume) flowing from the front end 81Af. The pressure adjustment mechanism 87 is formed with either an automatic damper or a fan, for example, which is similar to the pressure adjustment mechanism 73. The automatic damper and the fan are each driven by an electric motor.

The rear pressure adjustment mechanism 89 is located between a connecting portion to the exhaust pipe 41B and the rear end 81Ab. Moreover, the pressure adjustment mechanism 89 may be located more adjacent to the rear end 81Ab than the connecting portion to the exhaust pipe 41B. The pressure adjustment mechanism 89 adjusts pressure of gas fed out of the substrate treating apparatus 1 (e.g., to the exhaust facility in the factory). The pressure adjustment mechanism 89 includes a plate-shaped vane member and a dial configured to control an inclination of the vane member. An operator manually turns the dial to control the inclination of the vane member. Moreover, the pressure adjustment mechanism 89 may be formed with either an automatic damper or a fan, for example, which is similar to the pressure adjustment mechanism 73. The pressure adjustment mechanism 89 is controlled, for example, in installation of the substrate treating apparatus 1.

The pressure sensor 85 is located between a connecting portion to the exhaust pipe 41B and the rear pressure adjustment mechanism 89. The pressure sensor 85 determines pressure within the horizontal exhaust pipe 81A behind a position where the two exhaust pipes 41A and 41B are joined. The front pressure adjustment mechanism 87 adjusts pressure of gas within the horizontal exhaust pipe 81A to be a predetermined value in accordance with the pressure determined by the pressure sensor 85.

Similar to the horizontal exhaust pipe 81A, the residual five horizontal exhaust pipes 82A, 83A, and 81B to 83B are each provided with the pressure sensor 85 and the two pressure adjustment mechanisms 87 and 89. Moreover, the front pressure adjustment mechanism 87 adjusts pressure of gas (airflow volume) within each of the horizontal exhaust pipes 82A, 83A, and 81B to 83B to be a predetermined value in accordance with the pressure determined by the pressure sensor 85.

2-2. Sharing of Treating Unit 21

Reference is made to FIG. 4. The treating units 21 each have the same configuration. Accordingly, all the treating units 21 are each arranged such that the treatment chamber 23, the chemical piping space 94, and the switching mechanism 51 (or exhaust chambers 53) are located side by side along the transportation space 12. Moreover, all the treating units 21 are each arranged such that the chemical piping space 94 is located on a first side of the treatment chamber 23 and the switching mechanism 51 faces the chemical piping space 94 across the treatment chamber 23 when seen from the transportation space 12. Detailed description about this is as under.

Firstly, "left hand side" and "right hand side" in this descriptions are irrespective of "left" and "right" in the width direction Y shown in FIG. 4. It is assumed, as shown in FIG. 4, that the indexer 3 and the treating block 11 align transversely. All the treating units 21A and 21B are each arranged such that the chemical piping space 94 is located on the right hand side of the treatment chamber 23 and the switching mechanism 51 is located on the left side of the treatment chamber 23 when seen from the transportation space 12. Here, the plane of the FIG. 4 is turned upside down. All the treating units 21C and 21D are each arranged such that the chemical piping space 94 is located on the right hand side of the treatment chamber 23 and the switching mechanism 51 is located on the left side of the treatment chamber 23 when seen from the transportation space 12.

In other words, the treating units 21C and 21D correspond to those made by turning the treating units 21A and 21B around an axis parallel to the vertical direction Z by 180 degrees. Moreover, a relative arrangement among the treatment chamber 23, the holder 31, and the liquid supplying unit 33, for example, is same as that among the treating units 21A, 21B, 21C, and 21D.

2-3. Control System of Substrate Treating Apparatus 1

The substrate treating apparatus 1 further includes a controller 97 (see FIG. 4). The controller 97 controls components of the substrate treating apparatus 1. For example, the controller 97 controls the transport mechanisms 6 and 16, the treating units 21, the on-off valves V1 to V3, the switching mechanisms 51, the pressure sensors (numeral 71, for example), and the pressure adjustment mechanisms (numeral 73, for example). The controller 97 is communicatively connected to these components.

The controller 97 is implemented by a central processing unit (CPU) that performs various processes, and a storage medium as a workspace of arithmetic processing such as a RAM (Random-Access Memory) and a fixed disk. The storage medium stores programs necessary for operation of the substrate treating apparatus 1.

Here, the transportation space 12 corresponds to the transportation path in the present invention. The transport mechanism 16 corresponds to the substrate transport mechanism in the present invention. The holder 31 and the rotation driving unit 32 correspond to the holding rotator in the present invention. The opening and closing portions 61 and 62 correspond to the opening and closing mechanisms in the present invention. The chemical piping space 94 corresponds to the chemical piping portion in the present invention. The pipes LN1 to LN3 correspond to the chemical pipes in the present invention.

3. Operation of Substrate Treating Apparatus 1

Reference is made to FIG. 4. An outline of operation of the substrate treating apparatus 1 will now be described. The transport mechanism 6 of the indexer 3 transports a substrate W from a carrier C on the carrier platform 4 to the substrate platform 14A, for example, of the two substrate platforms 14A and 14B. The transport mechanism 16A in the treating block 11 transports the substrate W from the substrate platform 14A to any of the upper twelve treating units 21. Specifically, the transport mechanism 16A enters into the treatment chamber 23 through the substrate transportation port 27, and thereafter, places the substrate W on the holder 31 of the treating unit 21.

The treating unit 21 performs a chemical treatment to a substrate W within the treatment chamber 23 (i.e., treating space 24). Specifically, the liquid supplying unit 33 supplies a chemical to the substrate W held by the holder 31. After the substrate W is treated, the transport mechanism 16A transports the substrate W from the holder 31 of the treating unit 21 to the substrate platform 14A. The transport mechanism 6 transports the substrate W from the substrate platform 14A to a carrier C on the carrier platform 4.

3-1. Exhaust Operation of Each Treating Unit 21

Reference is made to FIG. 9. The transport mechanism 16A in the treating block 11 transports the substrate W onto the holder 31 of the treating unit 21. The substrate holder 31 holds the substrate W. Here, it is assumed that the three exhaust pipes 41 to 43 (41A to 43A) are used as under, for example. The exhaust pipe 41 is used for acid exhaust. The exhaust pipe 42 is used for alkaline exhaust, and the exhaust pipe 43 is used for organic exhaust.

Firstly, the following describes a chemical treatment to a substrate W with supply of an acid chemical. The opening and closing portion 61 of the switching mechanism 51 closes the distributing opening 67, selected from the first communication channel 63 and the distributing opening 67, as shown in FIG. 11A. Accordingly, the distributing portion 56 of the exhaust chamber 53 is switched to the exhaust pipe 41. Thereafter, gas from the treatment chamber 23 is fed to the exhaust pipe 41.

Thereafter, the base 37A of the liquid supplying unit 33 shown in FIG. 9 rotates the nozzle 34A around the rotation axis A4. Accordingly, the distal end 35A of the nozzle 34A is moved from a standby position outside of the substrate W to a predetermined position (chemical ejecting position) above the substrate W. Thereafter, the on-off valve V1 (see FIG. 10) is brought into an opened state, whereby an acid chemical is supplied to the substrate W from an outlet, not shown, of the distal end 35A. Here, the rotation driving unit 32 rotates the holder 31, holding the substrate W, around the rotation axis A3 as necessary. When the acid chemical is dispensed, vapor of the acid chemical is generated within the treatment chamber 23. Gas containing the vapor of the acid chemical is exhausted from the exhaust port 52. Gas passing through the exhaust port 52 is fed to the introducing portion 55 and the distributing portion 56 in this order, and then fed to the exhaust pipe 41 that is in communication with the distributing portion 56.

Next, the following describes a chemical treatment to a substrate W with supply of an alkaline chemical. The opening and closing portion 61 of the switching mechanism 51 closes the first communication channel 63, selected from the first communication channel 63 and the first distributing opening 67, as shown in FIG. 11B. Moreover, the opening and closing portion 62 closes the second distributing opening 68, selected from the second communication channel 64 and the second distributing opening 68. Accordingly, the distributing portion 56 of the exhaust chamber 53 is switched to the exhaust pipe 42. Thereafter, gas from the treatment chamber 23 is fed to the exhaust pipe 42.

Thereafter, the base 37B of the liquid supplying unit 33 shown in FIG. 9 moves the distal end 35b of the nozzle 34B from the standby position to the chemical ejecting position above the substrate W. Thereafter, the on-off valve V2 (see FIG. 10) is brought into an opened state, whereby an alkaline chemical is supplied to the substrate W from an outlet, not shown, of the distal end 35B. When the alkaline chemical is dispensed, vapor of the alkaline chemical is generated within the treatment chamber 23. Gas containing the vapor of the alkaline chemical is exhausted from the exhaust port 52. Gas passing through the exhaust port 52 is fed to the exhaust pipe 42.

Next, the following describes a chemical treatment to a substrate W with supply of an organic chemical. The opening and closing portion 61 of the switching mechanism 51 closes the first communication channel 63, as shown in FIG. 11C. Moreover, the opening and closing portion 62 closes the second communication channel 64, selected from the second communication channel 64 and the second distributing opening 68. Accordingly, the distributing portion 56 of the exhaust chamber 53 is switched to the exhaust pipe 43. Thereafter, gas from the treatment chamber 23 is fed to the exhaust pipe 43.

Thereafter, the base 37C of the liquid supplying unit 33 shown in FIG. 9 moves the distal end 35C of the nozzle 34C from the standby position to the chemical ejecting position above the substrate W. Thereafter, the on-off valve V3 (see FIG. 10) is brought into an opened state, whereby an organic chemical is supplied to the substrate W from an outlet, not shown, of the distal end 35C. When the organic chemical is dispensed, vapor of the organic chemical is generated within the treatment chamber 23. Gas containing the vapor of the organic chemical is exhausted from the exhaust port 52. Gas passing through the exhaust port 52 is fed to the exhaust pipe 43.

The pressure sensor 71 detects pressure of gas adjacent to the exhaust port 52. The pressure adjustment mechanism 73 adjusts pressure of gas (airflow volume), sucked from the exhaust port 52, to be a predetermined value in accordance with the pressure detected by the pressure sensor 71.

3-2. Exhaust Operation of Each Treating Units 21A and 21B

Reference is made to FIG. 12. The switching mechanism 51 (exhaust chamber 53) of each of the treating units 21A in six stages is in communication with the three exhaust pipes 41A, 42A, and 43A. Moreover, the switching mechanism 51 of each of the treating units 21B in six stages is in communication with the three exhaust pipes 41B, 42B, and 43B. Moreover, the two exhaust pipes 41A and 41B are in communication with the first horizontal exhaust pipe 81A. The two exhaust pipes 42A and 42B are in communication with the second horizontal exhaust pipe 82A, and the two exhaust pipes 43A and 43B are in communication with the third horizontal exhaust pipe 83A.

The twelve switching mechanisms 51 perform switching operation individually. For example, it is assumed that a chemical treatment is performed as under. The treating units 21A in six stages supply an acid chemical to the substrate W. Moreover, the treating units 21B in the upper four stages supply an alkaline chemical to the substrate W, and the treating units 21B in the lower two stages supply an organic chemical to the substrate W. In this case, the switching mechanisms 51 of the treating units 21A in the six stages each switch the exhaust path of gas from the treatment chamber 23 to the exhaust pipe 41A. Moreover, the switching mechanisms 51 of the treating units 21B in the upper four stages each switch the exhaust path of gas from the treatment chamber 23 to the exhaust pipe 42B, and the switching mechanisms 51 of the treating units 21B in the lower two stages each switch the exhaust path of gas from the treatment chamber 23 to the exhaust pipe 43B.

The gas from the treating units 21A in the six stages is fed externally from the rear end 81Ab through the exhaust pipe 41A and the horizontal exhaust pipe 81A. Moreover, the gas from the treating units 21B in the upper four stages is fed externally from the rear end 82Ab through the exhaust pipe 42B and the horizontal exhaust pipe 82A, and the gas from the treating units 21B in the lower two stages is fed externally from the rear end 83Ab through the exhaust pipe 43B and the horizontal exhaust pipe 83A.

In FIG. 12, the twelve pressure adjustment mechanisms 73 of the twelve treating units 21A and 21B perform pressure adjustment individually in accordance with the pressure detected by the corresponding pressure sensors 71. Moreover, the three pressure adjustment mechanisms 87 provided on the three horizontal exhaust pipes 81A to 83A perform pressure adjustment individually in accordance with the pressure detected by the corresponding pressure sensors 85. Here in FIG. 12, the three pressure adjustment mechanisms 87 are controlled independently of the twelve pressure adjustment mechanisms 73.

For example, the pressure adjustment mechanism 87 on the first horizontal exhaust pipe 81A performs pressure adjustment in accordance with pressure of gas (e.g., gas containing vapor of the acid chemical) determined by the pressure sensors 85, the gas being fed from the treating units 21A in the six stages through the exhaust pipe 41A. Likewise, the pressure adjustment mechanism 87 on the second horizontal exhaust pipe 82A performs pressure adjustment in accordance with pressure of gas (e.g., gas containing vapor of the alkaline chemical) determined by the pressure sensors 85, the gas being fed from the treating units 21B in the upper four stages through the exhaust pipe 42B. Moreover, the pressure adjustment mechanism 87 on the third horizontal exhaust pipe 83A performs pressure adjustment in accordance with pressure of gas (e.g., gas containing vapor of the organic chemical) determined by the pressure sensors 85, the gas being fed from the treating units 21B in the lower two stages through the exhaust pipe 43B.

Here in the treating units 21A in the six stages shown in FIG. 12, a distance of the exhaust pipe 41A to the horizontal exhaust pipe 81A is longer from the treating unit 21A in the lowermost stage (first stage) than that from the treating unit 21A in the uppermost stage (sixth stage), for example. Accordingly, a degree of opening of the pressure adjustment mechanism 73 (e.g., automatic damper) is made larger toward the treating unit 21A in the lowermost stage. That is, an airflow volume is made larger. Moreover, the horizontal exhaust pipe 81A is longer than the horizontal exhaust pipe 81B, for example. Accordingly, a degree of opening of the pressure adjustment mechanism 73 (e.g., automatic damper) is made larger.

According to the present embodiment, all the treating units 21 are arranged such that the treatment chamber 23, the chemical piping space 94, and the exhaust chamber 53 (switching mechanism 51) are located side by side along the transportation space 12, the chemical piping space 94 is located on the first side of the treatment chamber 23, and the exhaust chamber 53 faces the chemical piping space 94 across the treatment chamber 23 when seen from the transportation space 12. The exhaust chamber 53 faces the chemical piping space 94 across the treatment chamber 23, leading to prevention of obstruction of the passage for passing a pipe, configured to supply the chemical to the substrate W held by the holder 31, by the exhaust pipe. Moreover, all the treating units 21 are arranged such that the chemical piping space 94 is located on a first side of the treatment chamber 23 and the exhaust chamber 53 faces the chemical piping space 94 across the treatment chamber 23 when seen from the transportation space 12. Consequently, a single type of treating units is enough for the substrate treating apparatus instead of two types of treating units 21 currently used. This results in sharing of components by all the treating units 21.

Here in FIG. 4, the exhaust chamber 53, the treatment chamber 23, and the chemical piping space 94 have different widths in the front-back direction X. In this case, if two treatment chambers 23 are located across the transportation space 12 so as to face each other, an excess region is generated, leading to an enlarged floor space, i.e., footprint, of the treating block 11 in the front-back direction X, for example. In this regard, according to the present embodiment, the treatment chambers 23 formed by the four treating units 21A to 21D are located in a so-called staggered (zigzag) manner along the transportation space 12. In other words, they are located so as to generate the excess region described above as little as possible. As a result, reduction in footprint of the treating block 11 is obtainable.

Moreover, the exhaust chamber 53 is also in communication with three exhaust pipes 41 to 43 extending in the up-down direction. The exhaust chamber 53 includes the opening and closing portions 61 and 62 that switch the exhaust path of gas from the treatment chamber 23 to one of the three exhaust pipes 41 to 43.

The exhaust chamber 53 (switching mechanism 51) is located laterally of the treatment chamber 23. Accordingly, the opening and closing portions 61 and 62 can switch exhaust adjacent to the treatment chamber 23. That is, the channel between the treatment chamber 23 and the opening and closing portions 61 and 62 of the exhaust chamber 53 can be shortened suitably. This enhances switch responsiveness largely than the case where exhaust is switched at a position higher in level than the treating unit 21 in the uppermost stage as in the state of the art.

Figure 2:
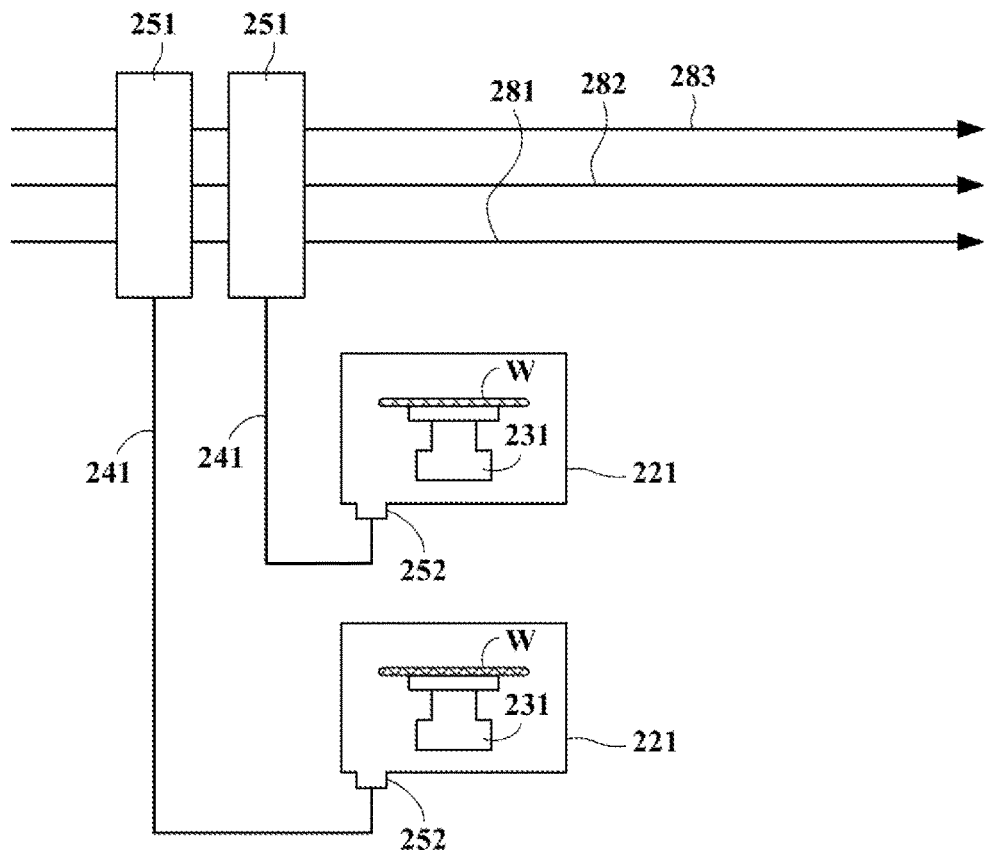
FIG. 2 is a piping diagram of an exhaust configuration of the currently-used substrate treating apparatus.
Figure 3:
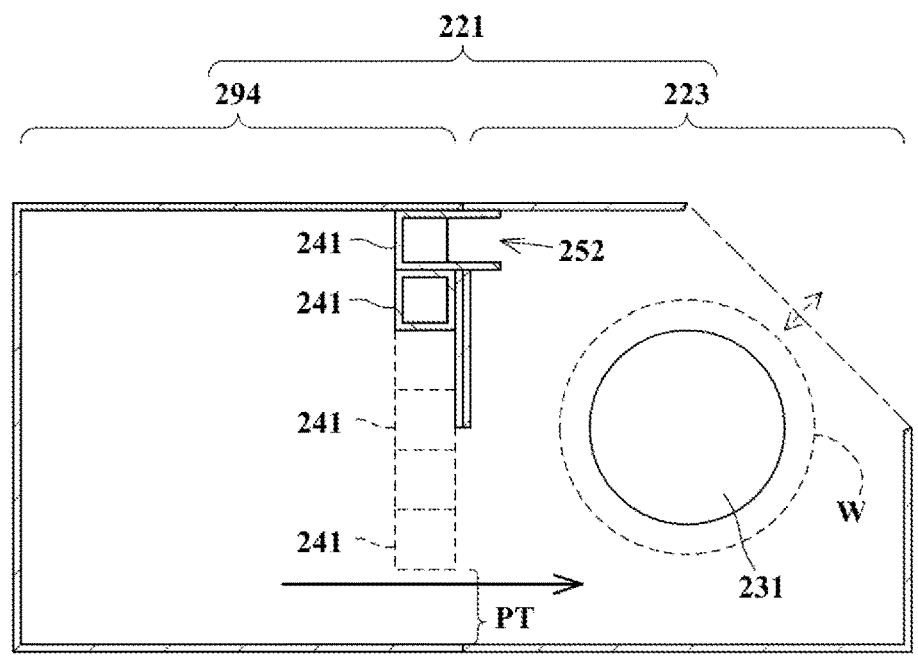
FIG. 3 illustrates a problem to be solved of a treating unit.

Moreover, in the case of the currently-used exhaust pipe 241 shown in FIG. 2, the exhaust pipe is common from the treatment chamber 223 to the exhaust switching device 251. Accordingly, if acid and alkaline chemical treatments are performed successively, crystal (salt) is generated and deposited due to exhaust mixture. Then, the deposition avoids exhaust, and thus cleaning within the exhaust pipe is needed with a cleaning liquid periodically. An exhaust pressure is unstable during the exhaust pipe cleaning. As a result, substrates cannot be treated, leading to possibility of decreased throughput of the substrate treating apparatus 1. With the switching mechanism 51 according to the present embodiment, mixture of acid and alkaline chemicals, for example, within the exhaust pipe can be held to the minimum. Consequently, contamination and damages on the channel between the treatment chamber 23 and the exhaust chamber 53 can be suppressed suitably.

In addition, the exhaust chamber 53 is located laterally of the treatment chamber 23, leading to suppression in height of the treating unit 21. Moreover, the opening and closing portions 61 and 62 can switch exhaust adjacent to the treatment chamber 23. Accordingly, the common exhaust pipes 41 to 43 are located for the treating units 21 laminated in one line in the up-down direction. Thus, the three exhaust pipes 41 to 43 lateral of the treatment chamber 23 can be arranged in a compact manner.

Moreover, the treatment chamber 23 further includes the liquid supplying unit 33 configured to supply a chemical to the substrate W held by the holder 31. When liquid supplying unit 33 supplies an acid chemical, the opening and closing portions 61 and 62 switch the exhaust path of gas from the treatment chamber 23 to the first exhaust pipe 41 selected from the three exhaust pipes 41 to 43. When liquid supplying unit 33 supplies an alkaline chemical, the opening and closing portions 61 and 62 switch the exhaust path of gas from the treatment chamber 23 to the second exhaust pipe 42 selected from the three exhaust pipes 41 to 43. When liquid supplying unit 33 supplies an organic chemical, the opening and closing portions 61 and 62 switch the exhaust path of gas from the treatment chamber 23 to the third exhaust pipe 43 selected from the three exhaust pipes 41 to 43.

Accordingly, the opening and closing portions 61 and 62 can switch the exhaust from the treatment chamber 23 to the first exhaust pipe 41, the second exhaust pipe 42, or the third exhaust pipe 43 in accordance with the chemical of acid, alkaline, or organic, respectively, supplied from the liquid supplying unit 33.

Moreover, the treatment chamber 23 has the lateral wall 25c facing the substrate transportation port 27 across the holder 31 in plan view. In the treatment chamber 23, the holder 31 is located more adjacent to the substrate transportation port 27 than the lateral wall 25c. In FIG. 9, a distance DT1 between the substrate transportation port 27 and the rotation axis A3 of the holder 31 is shorter than a distance DT2 between the rotation axis A3 of the holder 31 and the lateral wall 25c (DT1<DT2). The three exhaust pipes 41 to 43 are arranged in line in a horizontal direction (width direction Y) perpendicular with respect to a direction where the transportation space 12 extends. The exhaust port 52 of the exhaust chamber 53 is located more adjacent to the transportation space 12 than the three exhaust pipes 41 to 43.

The nozzle 34B and the like is located on the lateral wall 25c in the treatment chamber 23. Accordingly, the holder 31 is likely to be located adjacent to the substrate transportation port 27. The exhaust port 52 of the exhaust chamber 53 is located more adjacent to the transportation space 12 than the three exhaust pipes 41 to 43. Accordingly, the exhaust port 52 can approach the holder 31 while installation areas of the exhaust chamber 53 and the three exhaust pipes 41 to 43 in plan view are made compact. This can feed vapor of the chemical around the holder 31 to the exhaust chamber 53 relatively smoothly.

Moreover, the three (plural) horizontal exhaust pipes 81A, 82A, and 83A are further provided that are provided in a position higher in level than the twenty-four treating units 21 and along the transportation space 12. The three horizontal exhaust pipes 81A, 82A, and 83A are in communication with the exhaust chambers 53 of the treating units 21 in the six stages, laminated in the up-down direction, via the three exhaust pipes 41, 42, and 43, respectively. Since the opening and closing portions 61 and 62 are provided in the exhaust chamber 53 lateral of the treatment chamber 23 in each of the treating units 21, the configuration of the connecting portions between the three horizontal exhaust pipes 81A, 82A, and 83A and the three exhaust pipes 41, 42, and 43, respectively, can be simplified.

Moreover, the exhaust chamber 53 includes the pressure adjustment mechanism 73. The pressure adjustment mechanism 73 is provided adjacent to the exhaust port 52, and adjusts pressure of gas passing through the exhaust port 52. Accordingly, the treating units 21 can adjust exhaust pressure individually. For example, the exhaust pressure in the treating units 21 can be adjusted more easily than the case where the exhaust from the treating units 21 is collected and thereafter the pressure of the exhaust is adjusted collectively.

The present invention is not limited to the foregoing examples, but may be modified as follows.

Figure 14:
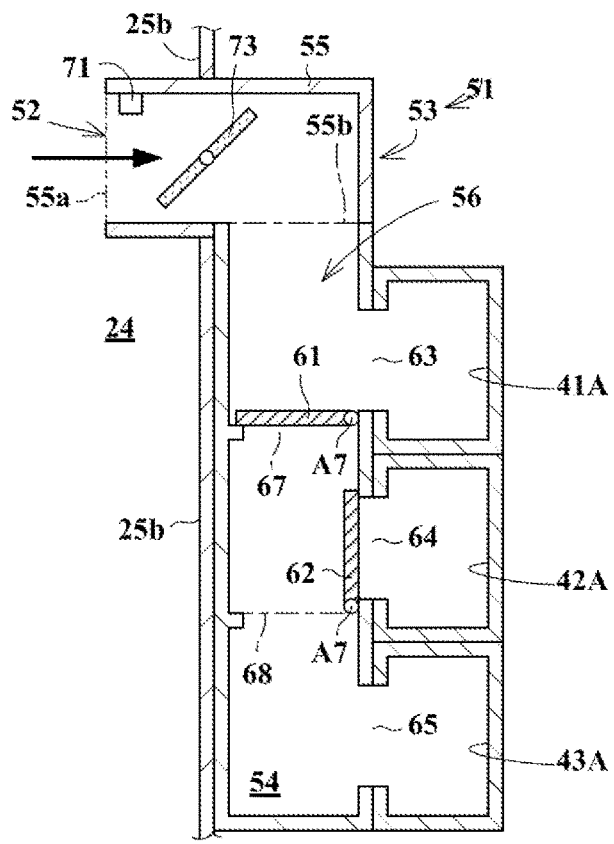
FIG. 14 illustrates a switching mechanism according to one modification.
Figure 15:
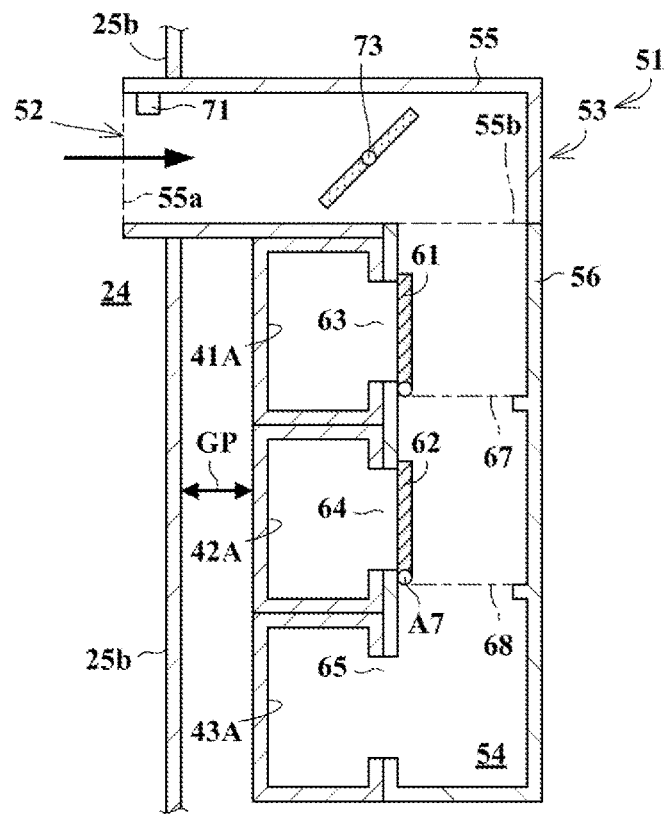
FIG. 15 illustrates a switching mechanism according to another modification.

(1) In the embodiment described above, the three exhaust pipes 41 to 43 align side by side in the Y-direction so as to contact to the treatment chamber 23, as shown in FIG. 4. In this regard, as shown in FIG. 14, the three exhaust pipes 41 to 43 and the treatment chamber 23 may be located so as to sandwich the distributing portion 56. Moreover, as shown in FIG. 15, the three exhaust pipes 41 to 43 and the treatment chamber 23 may be located by a gap GP.

Figure 16:
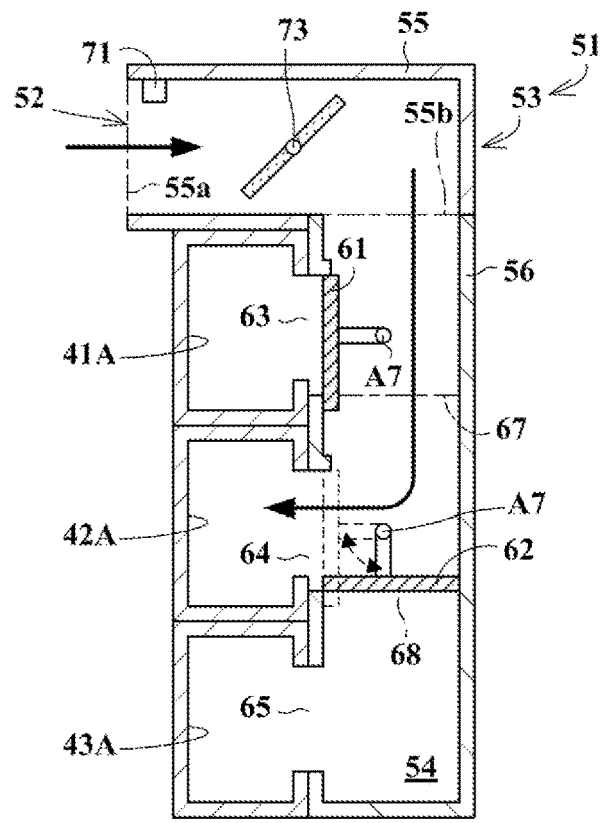
FIG. 16 illustrates a switching mechanism according to another modification.

(2) In the embodiment and the modification (1) described above, the distributing portion 56 of the switching mechanism 51 shown in FIG. 9 includes the two opening and closing portions 61 and 62. The two opening and closing portions 61 and 62 are formed in a flat plate shape (I-shape). In this regard, as shown in FIG. 16, two opening and closing portions 61 and 62 may be formed in a shape having a flat plate and an arm extending from the flat plate to the rotation axis A7, i.e., having a T-shaped in a cross section (T-type). Moreover, the distributing portion 56 shown in FIG. 9 may include three opening and closing portions configured to open and close the three communication channels 63, 64, and 65, respectively.

Figure 17:
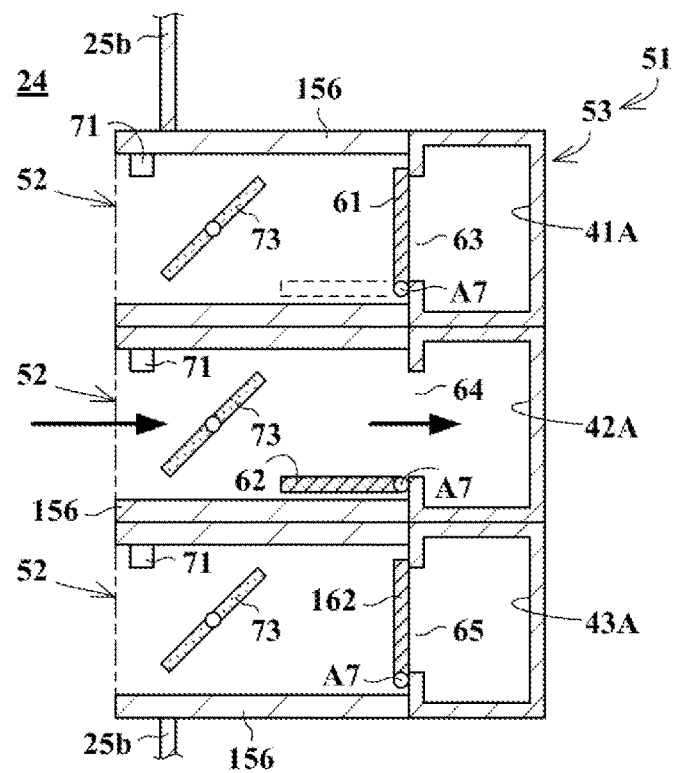
FIG. 17 illustrates a switching mechanism according to another modification.

(3) In the embodiment and the modifications described above, the three exhaust pipes 41 to 43 are in communication with one distributing portion 56 as the exhaust path as shown in FIG. 9. In this regard, as shown in FIG. 17, the three exhaust pipes 41 to 43 may each have an exhaust path 156. Note that the numeral 162 denotes a third opening and closing portion.

(4) In the above embodiment and the modifications described above, the treating block 11 includes the two substrate transport mechanisms 16A and 16B as shown in FIG. 5. The upper transport mechanism 16A transports substrates W to the treating units 21 (21A to 21D) in the upper three stages, and the lower transport mechanism 16B transports substrates W to the treating units 21 in the lower three stages. Accordingly, the two substrate transport mechanisms 16A and 16B can share substrate transportation even when the number of stages (e.g., six stages) of the treating units 21 increases. Here, the treating block 11 is not limited to the two transport mechanisms 16, but may include one transport mechanism 16 or three or more transport mechanisms 16. The three or more substrate transport mechanisms 16 transport substrates W to a plurality of treating units in a predetermined stage of a plurality of treating units 21 laminated in the up-down direction.

Figure 18:
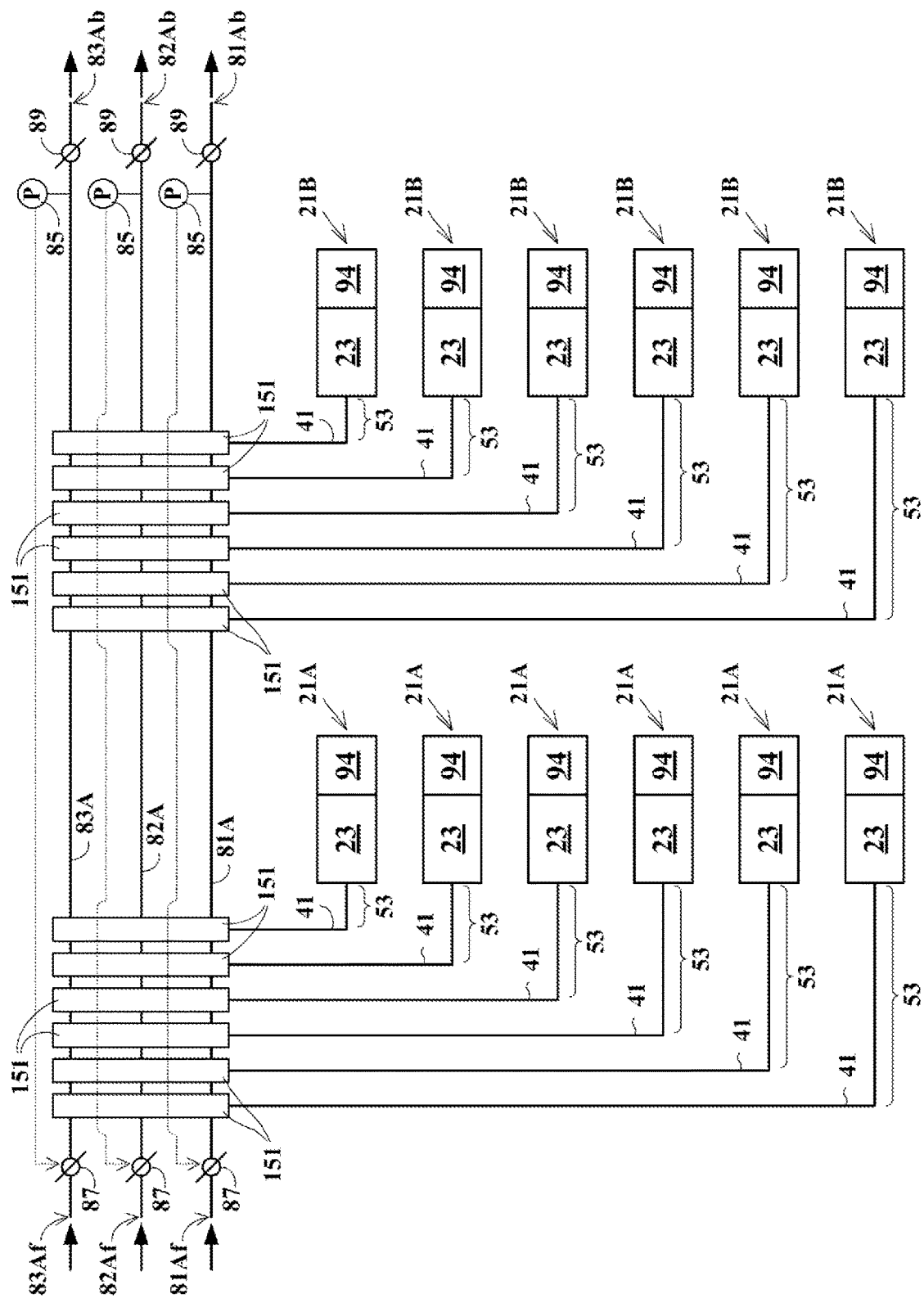
FIG. 18 is a piping diagram of an exhaust configuration of the substrate treating apparatus according to the modification.

(5) In the embodiment and the modifications described above, the switching mechanism 51 is provided laterally of the treatment chamber 23, i.e., at a position substantially equal in height to the treatment chamber 23. A device 151 configured to switch exhaust may be provided in each of the three horizontal exhaust pipes 81A to 83A as shown in FIG. 18 as necessary. In this case, the chemical piping space 94 is located so as to contact the treatment chamber 23. The exhaust chamber 53 faces the chemical piping space 94 across the treatment chamber 23. The exhaust chamber 53 is in communication with the treatment chamber 23 and is also in communication with one exhaust pipe 41.

In this modification, six exhaust pipes 41 are located in the exhaust pipe space 44 (see FIG. 9), laterally of the treating unit 21 in the uppermost stage (sixth stage). This results in compression of the exhaust pipe space 44. Accordingly, in the treating unit 21 shown in FIG. 9, the switching mechanism 51 (exhaust chamber 53) is connected to the common three exhaust pipes 41 to 43. Consequently, the number of exhaust pipes (three) extending in the up-down direction is not variable even when the number of stages of the treating units 21 increases. Thus, the three exhaust pipes 41 to 43 lateral of the treatment chamber 23 can be arranged in a compact manner.

(6) In the embodiment and the modifications described above, the liquid supplying unit 33 supplies the acid chemical, the alkaline chemical, and the organic chemical. In this regard, the liquid supplying unit 33 may further supply one or more types of chemical other than the acid chemical, the alkaline chemical, and the organic chemical. In this case, four or more common exhaust pipes extending in the up-down direction are in communication with the exhaust chamber 53. Moreover, the liquid supplying unit 33 may be configured to supply two different types of chemicals selected from the acid chemical, the alkaline chemical, and the organic chemical. In this case, two common exhaust pipes extending in the up-down direction are in communication with the exhaust chamber 53.

(7) In the embodiment and the modifications described above, the rotation axis A3 of the holder 31 (see FIG. 9) is not located at the center of the treating units 21 in the front-back direction X. In this regard, the rotation axis A3 of the holder 31 may be located at the center of the treating unit 21 in the front-back direction X.

Figure 19:
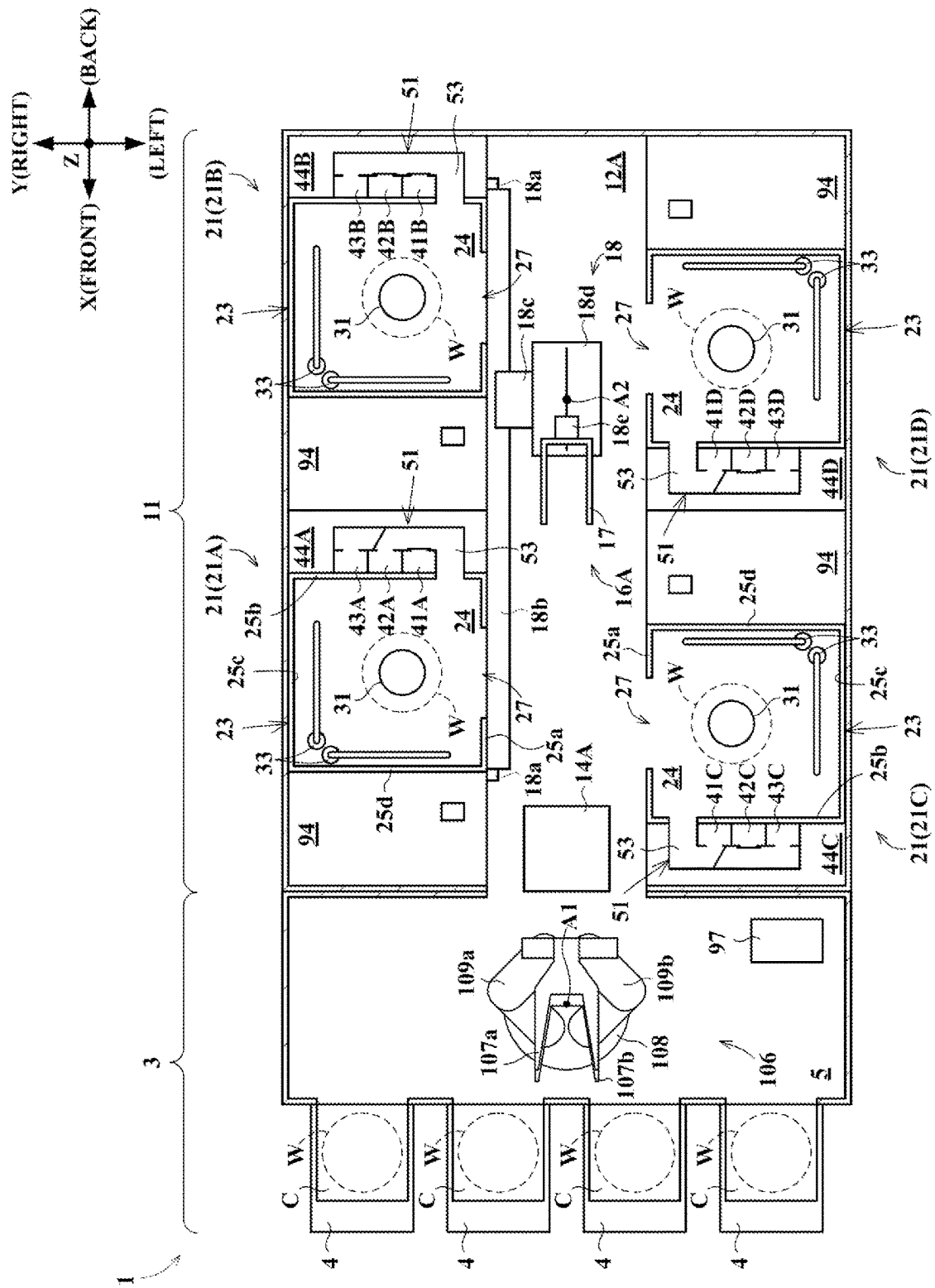
FIG. 19 is a traverse sectional view illustrating a substrate treating apparatus according to one modification.

(8) In the embodiment and the modifications described above, the treating units 21 are arranged such that the chemical piping space 94, the treatment chamber 23, and the switching mechanism 51 are located in this order from the left side of the plane of FIG. 9 when the substrate transportation port 27 is located on the upper side in the plane of FIG. 9. In this regard, the components of the treating unit 21 shown in FIG. 9 may be located in a left-right reversal manner (see FIG. 19). In this case, if the substrate transportation port 27 is located on the upper side in the plane of FIG. 9, the switching mechanism 51, the treatment chamber 23, and the chemical piping space 94 are located in this order from the left side of the plane of FIG. 9. Moreover, the twenty-four treating units 21 of the treating block 11 are formed by a single type of treating units having the components configured in the left-right reversal manner.

Moreover, the horizontally moving portion 8b of the transport mechanism 6 shown in FIG. 4 moves in the width direction Y with respect to the rail 8a. Accordingly, the vertically moving portion 8c can move in the width direction Y. In this regard, a vertically moving portion 108 of a transport mechanism 106 shown in FIG. 19 may be fixed to the bottom of the transportation space 5 without moving in the width direction Y. In this case, the transport mechanism 106 includes the vertically moving portion 108, two articulated arms 109a and 109b, and two hands 107a and 107b. The vertically moving portion 108 moves vertically in the up-down direction Z and rotates around the rotation axis A1. The vertically moving portion 108 supports the two articulated arms 109a and 109b. The first articulated arm 109a includes a front end to which the first hand 107a is attached, and the second articulated arm 109b includes a front end to which the second hand 107b is attached. The transport mechanism 106 can access carriers C placed on four carrier platforms 4.

The present invention may be embodied in other specific forms without departing from the spirit or essential attributes thereof and, accordingly, reference should be made to the appended claims, rather than to the foregoing specification, as indicating the scope of the invention.

What is claimed is:

1. A substrate treating apparatus for treating substrates, comprising:
    a substrate transport mechanism configured to transport a substrate; and
    a plurality of treating units each configured to perform a predetermined chemical treatment to the substrate transported by the substrate transport mechanism,
    the plurality of treating units being located side by side along a transportation path of the substrate transport mechanism, and being located so as to face each other across the transportation path and so as to be laminated in an up-down direction,
    the treating units each including:
        a treatment chamber as an area where a holding rotator configured to rotate the substrate while holding the substrate is provided, and the chemical treatment is performed to the substrate held and rotated by the holding rotator, and the substrate is delivered to and from the substrate transport mechanism via a substrate transportation port;
        a chemical piping portion as an area where a chemical pipe for supplying a chemical to the treatment chamber is located; and
        an exhaust chamber in communication with the treatment chamber via an exhaust port for exhausting gas from the treatment chamber, and also in communication with an exhaust pipe extending in the up-down direction, and
    all the treating units each being arranged such that the treatment chamber, the chemical piping portion, and the exhaust chamber are located side by side along the transportation path, and the chemical piping portion is located on a first side of the treatment chamber and the exhaust chamber faces the chemical piping portion across the treatment chamber when seen from the transportation path.

2. The substrate treating apparatus according to claim 1, wherein
    the exhaust chamber is in communication with a plurality of exhaust pipes extending in the up-down direction, and
    the exhaust chamber includes an opening and closing mechanism configured to switch an exhaust path of gas from the treatment chamber to one of the plurality of exhaust pipes.

3. The substrate treating apparatus according to claim 2, wherein
    the treatment chamber further includes a liquid supplying unit configured to supply a chemical to the substrate held by the holding rotator,
    the opening and closing mechanism switches the exhaust path of the gas from the treatment chamber to a first exhaust pipe of the plurality of exhaust pipes when the liquid supplying unit supplies an acid chemical,
    the opening and closing mechanism switches the exhaust path of the gas from the treatment chamber to a second exhaust pipe of the plurality of exhaust pipes when the liquid supplying unit supplies an alkaline chemical, and
    the opening and closing mechanism switches the exhaust path of the gas from the treatment chamber to a third exhaust pipe of the plurality of exhaust pipes when the liquid supplying unit supplies an organic chemical.

4. The substrate treating apparatus according to claim 2, wherein
    the treatment chamber includes a lateral wall that faces the substrate transportation port across the holding rotator in plan view,
    the holding rotator is located more adjacent to the substrate transportation port than the lateral wall in the treatment chamber,
    the plurality of exhaust pipes are arranged in line in a horizontal direction perpendicular with respect to a direction where the transportation path extends, and
    the exhaust port of the exhaust chamber is located more adjacent to the transportation path than the plurality of exhaust pipes.

5. The substrate treating apparatus according to claim 2, further comprising:
    a horizontal exhaust pipe provided in a position higher in level than the plurality of treating units along the transportation path, wherein
    the horizontal exhaust pipe is in communication with each of the exhaust chambers of the treating units laminated in line in the up-down direction via the exhaust pipe.

6. The substrate treating apparatus according to claim 1, wherein
    the exhaust chamber includes a pressure adjustment mechanism provided adjacent to the exhaust port and configured to adjust pressure of gas passing through the exhaust port.

7. The substrate treating apparatus according to claim 1, further comprising:
    one or more substrate transport mechanisms, wherein
    the substrate transport mechanisms each transport substrates to a predetermined stage of a plurality of treating units of the treating units laminated in the up-down direction.

* * * * *